United States Patent
Noguchi et al.

(10) Patent No.: US 6,258,459 B1
(45) Date of Patent: Jul. 10, 2001

(54) MULTILAYER THIN FILM

(75) Inventors: Takao Noguchi; Yoshihiko Yano, both of Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/300,452

(22) Filed: Apr. 28, 1999

(30) Foreign Application Priority Data

Apr. 28, 1998 (JP) .................................................. 10-134634
Mar. 10, 1999 (JP) .................................................. 11-062864

(51) Int. Cl.$^7$ ................................ B32B 9/04; C23C 16/00
(52) U.S. Cl. .......................... 428/446; 428/700; 428/701; 428/702; 365/145; 117/944; 505/191; 427/248.1; 427/250
(58) Field of Search ..................... 428/446, 700, 428/701, 702; 365/145; 117/944; 505/191; 427/248.1, 250

(56) References Cited

U.S. PATENT DOCUMENTS

| | | |
|---|---|---|
| 5,753,934 | 5/1998 | Yano et al. . |
| 5,801,105 | 9/1998 | Yano et al. . |
| 5,810,923 | 9/1998 | Yano et al. . |
| 5,828,080 | 10/1998 | Yano et al. . |
| 5,985,404 * | 11/1999 | Yano et al. .......................... 428/65.3 |
| 6,096,434 * | 8/2000 | Yano et al. .......................... 428/446 |

FOREIGN PATENT DOCUMENTS

| | | |
|---|---|---|
| 9-110592 | 4/1997 | (JP) . |
| 10-287494 | 10/1998 | (JP) . |

OTHER PUBLICATIONS

Byung–Eun Park et al, "Fabrication of $Pbzr_x$–$Ti_{x-1}O_3$ Films on Si Structures Using $Y_2O_3$ Buffer Layers", Jpn. J. Appl. Phys. vol. 38 (1998), pp. 5145–5149 (no month).
Fukumoto et al, "Heteroepitaxial Growth of Yttia–Stabilized Zirconia (YSZ) on Silicon", Japanese Journal of Applied Physics, vol. 27, No. 8, Aug. 1988, p. L1404–L–1405.
Morita et al, "Growth of crystalline zirconium dioxide films on silicon", J. Appl. Phys. 58(6), Sep. 15, 1985, 2407–2409.

* cited by examiner

*Primary Examiner*—Deborah Jones
*Assistant Examiner*—Bryant Young
(74) *Attorney, Agent, or Firm*—Oblon, Spivak, McClelland, Maier & Neustadt, P.C.

(57) ABSTRACT

The first object of the invention is to provide means that enables a perovskite oxide thin film having (100) orientation, (001) orientation or (111) orientation to be easily obtained, and the second object of the invention is to provide a multilayer thin film comprising a unidirectionally oriented metal thin film of good crystallinity. The multilayer thin film according to the first embodiment of the invention comprises a buffer layer and a perovskite oxide thin film present thereon. The interface between the buffer layer and the perovskite oxide thin film is made up of a {111} facet plane. Substantially parallel to the facet plane there is present a {110} face of a cubic, rhombohedral, tetragonal or orthorhombic crystal of the perovskite oxide thin film, a {101} face of the tetragonal or orthorhombic crystal or a {011} face of the orthorhombic crystal. The multilayer thin film according to the second embodiment of the invention comprises a metal thin film that is a cubic (100) unidirectionally oriented epitaxial film, and a buffer layer where a {111} facet plane is present on the interface of the buffer layer in contact with the metal thin film.

18 Claims, 12 Drawing Sheets

{111} FACET PLANE
(100) ORIENTED BUFFER LAYER (100)
<111>

(100)
(100) ORIENTED METAL THIN FILM

10nm

MULTILAYER THIN FILM

BACKGROUND OF THE INVENTION

1. Art Field

This invention relates to a multilayer thin film structure comprising a perovskite oxide thin film or a metal thin film.

2. Background Art

Electronic devices have been elaborated which are fabricated by forming various function films such as superconducting, dielectric, ferroelectric or piezoelectric films on silicon substrates or semiconductor crystal substrates, followed by integration. For example, for the combination of semiconductors with superconductors, SQUIDs, Josephson devices, superconducting transistors, electromagnetic wave sensors and superconducting wired LSIs are contemplated. For the combination of semiconductors with dielectric materials, LSIs having a higher degree of integration and dielectric isolated LSIs relying on SOI technology are contemplated. For the combination of semiconductors with ferroelectric materials, non-volatile memories, infrared sensors, optical modulators, optical switches and OEICs (opto-electronic integrated circuits) are contemplated. For devices harnessing piezoelectric films, acoustic surface wave devices, filters, VCOs and resonators have been contemplated.

To ensure optimum device characteristics and reproducibility thereof for these electronic devices, it is desired that the function films be of good crystallinity. With omnidirectionally oriented polycrystalline materials, it is difficult to provide good device characteristics on account of the disturbances of physical quantities.

Among typical function films used for ferroelectric films, there is a perovskite oxide thin film. When the perovskite oxide thin film is formed on an Si substrate, it is known to interleave a buffer layer, e.g., a stabilized zirconia thin film or a rare earth oxide thin film between the perovskite oxide thin film and the substrate, as disclosed in JP-A's 9-110592 and 10-223476 published under the name of the applicant. For instance, the above JP-A 10-223476 teaches that to form a perovskite oxide thin film having tetragonal (001) orientation, the stress caused by a misfit between the buffer layer and the perovskite oxide thin film is used. In the present disclosure, that a film is of (001) orientation, for instance, means that the (001) face is present substantially parallel to the surface of the film.

A perovskite oxide thin film having ferroelectricity has generally an axis of polarization in the [001] direction in the case of a tetragonal crystal system, and in the [111] direction in the case of a rhombohedral crystal system. In order that the perovskite oxide thin film, for instance, can function well as a ferroelectric thin film, it should preferably be oriented in the (001) or (111) direction. However, since the perovskite oxide thin film is likely to have tetragonal (110) orientation or tetragonal (101) orientation on the above buffer layer, it is difficult to obtain a film in which the tetragonal (001) face or rhombohedral (111) face vertical to the axis of polarization is oriented. For instance, $BaTiO_3$ is likely to have (110) orientation because it tends to form $BaZrO_3$ (110) on zirconia (001). $PbTiO_3$, too, is likely to have (110) or (101) orientation on zirconia (001). In addition, $PbZr_xTi_{1-x}O_3$ (PZT) is oriented on $Y_2O_3$ (111), and $CeO_2$ (111) in the (101) direction, as reported in Jpn. J. Appl. Phys. 37(Pt. 1, No. 9B), 5145–5149 (1998).

To obtain a perovskite oxide thin film oriented in the axis-of-polarization direction such as one of tetragonal (001) orientation or rhombohedral (111) orientation, it is important that the thin film be oriented in the direction corresponding to such orientation during thin film growth. For instance, when a $PbTiO_3$ (001) oriented film is formed, it is required to oriente this film in the (100) direction during film growth, because the $PbTiO_3$ film appears as a tetragonal crystal at normal temperature, but it appears generally as a cubic crystal that is a high-temperature phase during film growth. If the $PbTiO_3$ film can grow as a cubic (100) oriented film, then it transforms to a tetragonal crystal in the process of cooling after growth, yielding a (001) unidiretionally oriented film or a 90° domain structure film in which (100) orientation and (001) orientation coexist. Whether the $PbTiO_3$ film appears as the (001) unidirectionally oriented film or the 90° domain structure film is determined depending on the difference in the coefficient of thermal expansion between the film and the substrate, and a lattice constant difference between the film and the buffer layer.

On the other hand, when the perovskite oxide thin film is used as a primer or subbing layer for a function film, for instance, when a Pt (100) oriented film is formed using a $BaTiO_3$ film as the primer layer, it is important that the primer layer be of (100) orientation. When a ferroelectric function film such as a $PbTiO_3$ film is formed on an electrode layer formed using a conductive perovskite oxide material such as $SrRuO_3$, it is important that $SrRuO_3$ be of (100) orientation or (001) orientation so as to obtain a function film of (001) orientation. In these cases, it is important that the perovskite oxide thin film formed as the primer or electrode layer be oriented in the (100) or (001) direction in the process of growth.

When the perovskite oxide thin film is formed on an Si substrate with a buffer layer interleaved between them, therefore, means is now desired, which enables the growing perovskite oxide thin film to be easily oriented in the (100), (001) or (111) direction depending on its crystal system.

Incidentally, an electrode film is usually provided between the Si substrate and the function film. To obtain a function film of good crystallinity, the electrode film must be formed as an epitaxial film close to a single crystal. To meet such demand, the inventors have proposed in the above JP-A 9-110592 to provide a buffer layer including a $ZrO_2$ thin film, a stabilized zirconia thin film, and a rare earth element oxide thin film, each of (001) orientation, on an Si single crystal substrate, form a perovskite layer of (001) orientation such as one made up of $BaTiO_3$ on the buffer layer, and form on the perovskite layer a metal thin film of Pt, etc., serving as an electrode film. The perovskite layer is provided for the following reason. If the Pt thin film is formed directly on the $ZrO_2$ (001) thin film, then the Pt (100) unidirectionally oriented film cannot be formed because Pt is of (111) orientation or appears as a polycrystal. This is because due to a large lattice mismatching between the $ZrO_2$ (001) face and the Pt (100) face, Pt grows while using the energetically stable (111) face as a growth face rather than grows epitaxially while using the (100) face as a growth face.

However, the perovskite layer is awkward to form, and it is particularly difficult to form a homogeneous perovskite layer having a composition as designed. For instance, when a $BaTiO_3$ thin film is formed on a Zr-containing buffer layer, a substance susceptible to (110) orientation, e.g., $BaZrO_3$ is likely to occur, as previously stated. In the above JP-A 9-110592, an evaporation process wherein metal vapor is fed to the surface of the substrate in an oxidizing gas atmosphere is used so that a large-area yet homogeneous thin film is formed. When the $BaTiO_3$ thin film is formed by this process, however, it is required to place the amount of evaporation of Ba and Ti under precise control because Ba:Ti=1:1 upon deposition of oxides on the surface of the substrate.

Therefore, if a (100) oriented metal thin film of good crystallinity can be formed without recourse to a perovskite layer formed by a prior art process, then great breakthroughs can be achieved in terms of cost reductions, quality improvements, and yield improvements.

One object of the invention is to provide means that enables a perovskite oxide thin film having (100) orientation, (001) orientation or (111) orientation to be easily obtained. Another object of the invention is to provide a multilayer thin film comprising a unidirectionally oriented metal thin film of good crystallinity.

Such objects are achievable by the inventions as defined below.

(1) A multilayer thin film comprising a buffer layer and a perovskite oxide thin film grown thereon, wherein:
an interface between said buffer layer and said perovskite oxide thin film is made up of a {111} facet plane, and
substantially parallel to said facet plane there is present a {110} face of a cubic, rhombohedral, tetragonal or orthorhombic crystal of said perovskite oxide thin film, a {101} face of said tetragonal or orthorhombic crystal or a {011} face of said orthorhombic crystal.

(2) The multilayer thin film according to (1), wherein said perovskite oxide thin film is an oriented film having one or two of (100) orientation, (001) orientation, and (010) orientation.

(3) The multilayer thin film according to (1), wherein said perovskite oxide thin film is a (111) unidirectionally oriented film.

(4) The multilayer thin film according to (1), wherein said perovskite oxide thin film is primarily composed of lead titanate, lead zirconate, or a solid solution thereof.

(5) The multilayer thin film according to (1), wherein said buffer layer contains a rare earth element oxide, zirconium oxide, or a zirconium oxide with a part of Zr substituted by a rare earth element or an alkaline earth element.

(6) The multilayer thin film according to (5), wherein an atomic ratio, R/(Zr+R), in said buffer layer is 0.2 to 0.75 provided that R represents a rare earth element, and an alkaline earth element.

(7) The multilayer thin film according to (5), which further comprises a primer layer on a side of said thin film that faces away from said perovskite oxide thin film with said buffer layer interleaved therebetween, said primer layer containing zirconium oxide or a zirconium oxide with a part of Zr substituted by a rare earth element or an alkaline earth element, provided that when said rare earth element and alkaline earth element are each represented by R, an atomic ratio, R/(Z+R), in said primer layer is smaller than said atomic ratio, R/(Z+R), in said buffer layer.

(8) The multilayer thin film according to (1), which is present on a substrate having a surface made up of a Si (100) single crystal.

(9) A multilayer thin film comprising a metal thin film that is a cubic (100) unidirectionally oriented epitaxial film, and a buffer layer wherein a {111} facet plane is present on an interface of said buffer that is in contact with said metal thin film.

(10) The multilayer thin film according to (9), wherein said buffer layer contains a rare earth element oxide, zirconium oxide, or a zirconium oxide with a part of Zr substituted by a rare earth element or an alkaline earth element.

(11) The multilayer thin film according to (10), wherein an atomic ratio, R/(Z+R), in said buffer layer is 0.2 to 0.75 provided that R represents a rare earth element, and an alkaline earth element.

(12) The multilayer thin film according to (10), which further comprises a primer layer on a side of said thin film that faces away from said metal thin film with said buffer layer interleaved therebetween, said primer layer containing zirconium oxide or a zirconium oxide with a part of Zr substituted by a rare earth element or an alkaline earth element, provided that when said rare earth element and alkaline earth element are each represented by R, an atomic ratio, R/(Z+R), in said primer layer is smaller than said atomic ratio, R/(Z+R), in said buffer layer.

(13) The multilayer thin film according to (9), wherein said metal thin film contains at least one of Pt, Ir, Pd, and Rh.

(14) The multilayer thin film according to (9), which is present on a substrate having a surface made up of a Si (100) single crystal.

EXPLANATION OF THE PREFERRED EMBODIMENTS

The multilayer thin film according to the first embodiment of the invention is formed on a substrate made up of Si single crystal, etc., and comprises a buffer layer on a substrate side and a perovskite oxide thin film that is in contact with the buffer layer. The multilayer thin film according to the second embodiment of the invention is formed on a substrate made up of Si single crystal, etc., and comprises a buffer layer on a substrate side and a metal thin film that is in contact with the buffer layer. In what follows, each embodiment is explained in detail.

First Embodiment

Figure 1A:
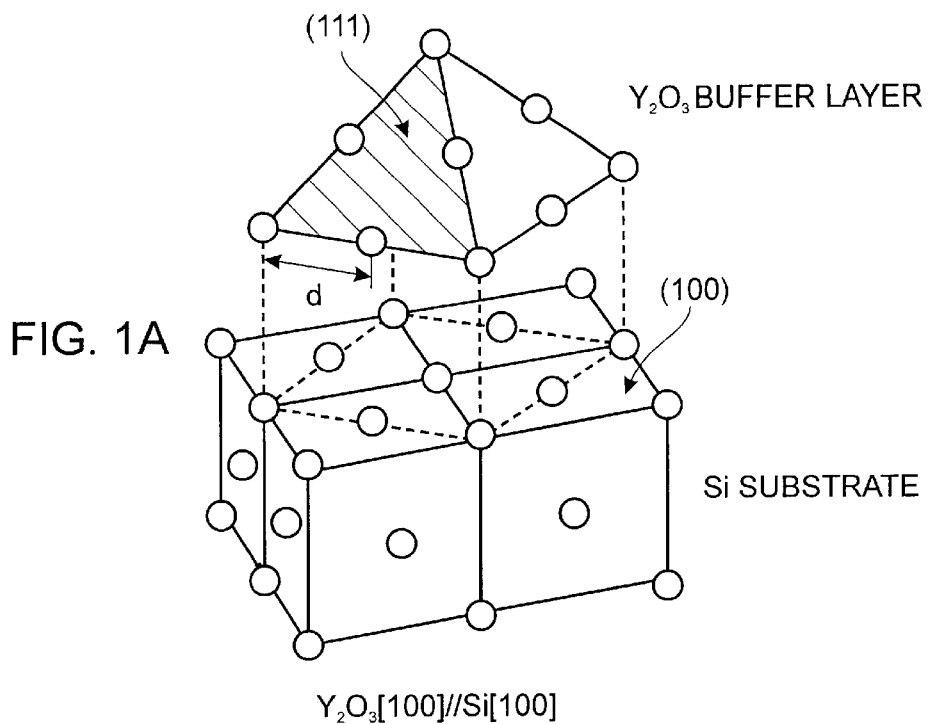
FIG. 1A is a schematic of a {111} facet plane on the surface of the buffer layer.

The buffer layer interleaved between the perovskite oxide thin film and the substrate is characterized in that the interface between the buffer layer and the perovskite oxide thin film is defined by a {111} facet plane. FIG. 1A is a schematic view depicting the surface of the buffer layer formed on an Si (100) single crystal substrate. While the buffer layer shown is composed of $Y_2O_3$, it is understood that oxygen atoms are not shown in FIG. 1A. In the invention, the buffer layer is a cubic (100) oriented, tetragonal (001) oriented or monoclinic (001) oriented epitaxial film, and so the facet plane shown is the {111} facet plane.

In the multilayer thin film according to this embodiment, substantially parallel to the {111} facet plane of the buffer layer there is present a {110} face of a cubic, rhombohedral, tetragonal or orthorhombic crystal of the perovskite oxide thin film, a {101} face of the tetragonal or orthorhombic crystal or a {011} face of the orthorhombic crystal. The perovskite oxide thin film is often in a cubic form in the process of film growth, as is the case with $PbTiO_3$. In this case, the cubic form may sometimes change to a rhombohedral, tetragonal or orthorhombic form after cooling. When a lattice constant misfit or the like occurs spontaneously or intentionally between the perovskite oxide thin film and the buffer layer, the perovskite oxide thin film grows in a cubic form, for instance. This cubic form may be kept intact even after cooling or alternatively change to a rhombohedral or other crystal system after cooling.

Figure 1B:
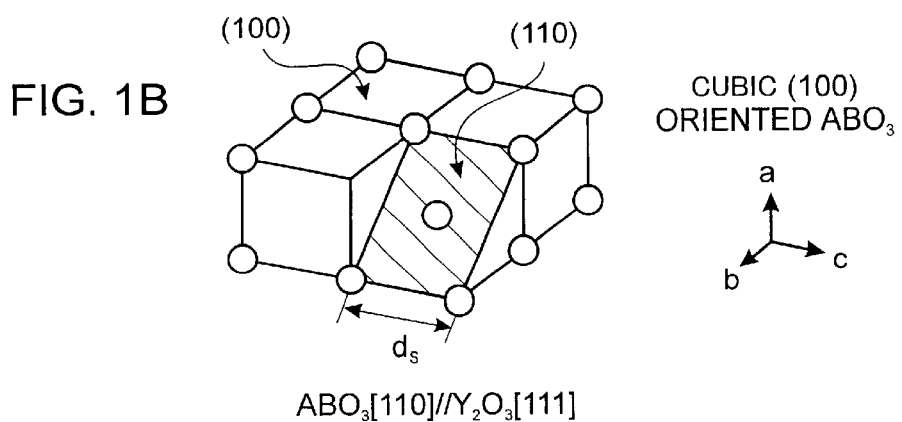
FIG. 1B is a schematic depicting an $ABO_3$ type perovskite crystal that is converted to a cubic (100) oriented film upon growth on the {111} facet plane.

First, an account is given of the growth in a cubic form of the perovskite oxide thin film on the {111} facet plane. FIG. 1B is a schematic view depicting the crystal structure of a perovskite oxide represented by the general formula: $ABO_3$. In FIG. 1B, it is noted that oxygen atoms are not shown, and that $ABO_3$ is assumed to be in a cubic form. For a better understanding of the following explanation, assume that all four faces defining the facet plane are (111) faces, and that the perovskite oxide grows such that each (111) face is parallel to the cubic $ABO_3$ (110) face of the perovskite oxide thin film.

Figure 1C:
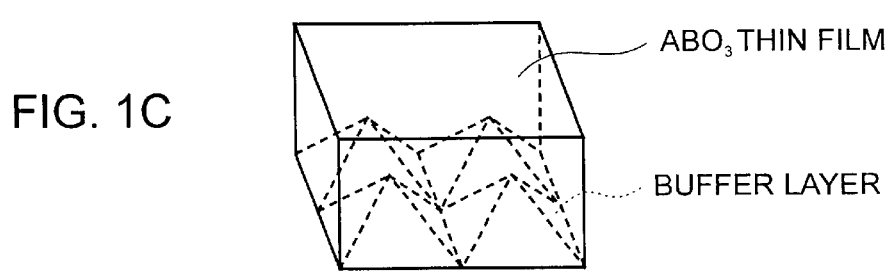
FIG. 1C is a schematic illustrative of an $ABO_3$ thin film formed on the FIG. 1A facet plane.

When the length $d_S$ of a short side of the $ABO_3$ (110) face shown in FIG. 1B matches with a lattice spacing d of the facet plane shown in FIG. 1A, the $ABO_3$ crystal grows with the (111) facet plane parallel to the cubic $ABO_3$ (110) face. As the $ABO_3$ thin film grows, depressions defined by the facet planes are filled up, and eventually the surface of the $ABO_3$ thin film becomes substantially flat, as shown in FIG. 1C, and this surface is substantially parallel to the surface of the substrate. In the initial stage of the growth process of such a thin film, the cubic (100) face of the $ABO_3$ thin film is estimated to be inclined about 9.7° with respect to the $Y_2O_3$ (100) face of the buffer layer. This also holds for $ABO_3$ crystals that grow on the four faces forming the facet plane. As the $ABO_3$ thin film grows on the facet plane, however, this inclination becomes small due to the distortion of crystal lattices and the occurrence of lattice defects. In the state shown in FIG. 1C, the (100) face of the $ABO_3$ thin film is substantially parallel to the $Y_2O_3$ (100) face, that is, the surface of the substrate.

When the $ABO_3$ thin film is made up of a material that changes to a cubic crystal in the process of post-growth cooling, like $PbTiO_3$, all or a part of the cubic (100) face parallel to the surface of the substrate changes to the tetragonal (001) face, yielding a film having a tetragonal (001) oriented crystal. Although depending on the composition of the $ABO_3$ thin film, on the other hand, the $ABO_3$ thin film may remain in an as-cubic (100) oriented state even after cooling or may change, upon cooling, to rhombohedral, tetragonal or orthorhombic (100) orientation, or orthorhombic (001) orientation or (010) orientation. In some cases, the $ABO_3$ thin film may have a domain structure depending on its thickness, a difference in the coefficient of thermal expansion between the thin film and the substrate, a lattice constant misfit between the thin film and the buffer layer, etc. For instance, when a $PbTiO_3$ thin film of 100 nm in thickness is formed on the {111} facet plane of a $Y_2O_3$ buffer layer provided on an Si (100) substrate, a domain structure comprising (100) oriented crystals and (001) oriented crystals is obtained.

Thus, when the perovskite oxide grows with the {111} facet plane of the buffer layer parallel to the cubic {110} face of the perovskite oxide thin film, i.e., the (110) face or a face equivalent thereto, the perovskite oxide thin film after cooling has the following structure.

First, when the perovskite oxide thin film remains in a cubic crystal form even after cooling or changes to a rhombohedral crystal after cooling, the {110} face of the cubic or rhombohedral crystal is substantially parallel to the {111} facet plane of the buffer layer, and the perovskite oxide thin film is of (100) orientation.

When the perovskite oxide thin film changes to a tetragonal crystal after cooling, on the other hand, the tetragonal {110} face, i.e., the (110) face or a face equivalent thereto, or the tetragonal {101} face, i.e., the (101) face or a face equivalent thereto is substantially parallel to the {111} facet plane. At this time, the perovskite oxide thin film is considered to be of (100) orientation or (001) orientation. In view of lattice matching, however, the perovskite oxide thin film is generally of (001) orientation with the {101} face substantially parallel to the {111} facet plane.

When the perovskite oxide thin film changes to an orthorhombic crystal after cooling, the orthorhombic {110} plane, i.e., the (110) plane or a plane equivalent thereto, the orthorhombic {101} face, i.e., the (101) face or a face equivalent thereto, or the orthorhombic {011} face, i.e., the (011) face or a face equivalent thereto is substantially parallel to the {111} facet plane. At this time, the perovskite oxide thin film is considered to be of (100) orientation, (001) orientation, or (010) orientation.

Figure 2:
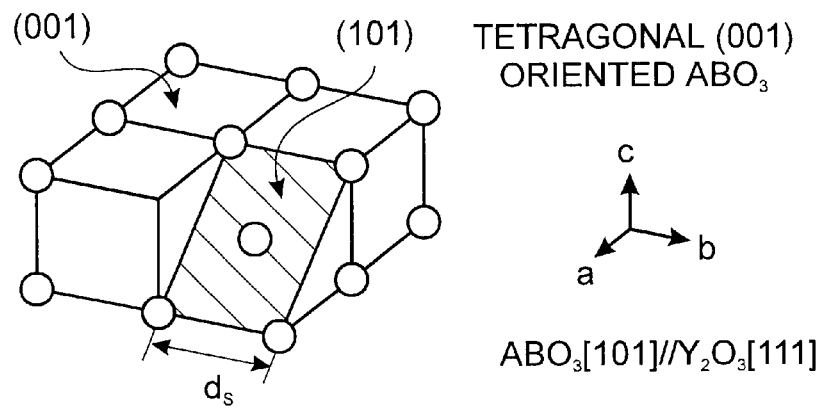
FIG. 2 is a schematic depicting an $ABO_3$ type perovskite crystal that is converted to a tetragonal (001) oriented film upon growth on the {111} facet plane.

The growth of the perovskite oxide thin film in a tetragonal crystal form is then explained with reference to the drawing. In this explanation, assume that all four faces forming a facet plane are defined by (111) faces, and perovskite oxide grows with each (111) face parallel to the (101) face of tetragonal perovskite oxide. When the length of a b axis (=the length of an a axis) of the tetragonal perovskite oxide, i.e., the length $d_S$ of the short side of the tetragonal (101) face shown in FIG. 2 matches with a lattice spacing d of the facet plane, the tetragonal {101} face of the perovskite oxide, i.e., the (101) face or a face equivalent thereto is parallel to the (111) facet plane with the result that the perovskite oxide thin film is a film of (001) orientation because its surface is substantially parallel to the $Y_2O_3$ (100) face.

It is here noted that when the perovskite oxide thin film grows in a tetragonal crystal form, the tetragonal {110} face may sometimes be parallel to the {111} facet plane.

The perovskite oxide thin film grown as mentioned above is a film comprising one or two of (100) orientation, (001) orientation, and (010) orientation. In other words, the perovskite oxide thin film is a domain structure film of one or two of these orientations.

Next, an account is given of the case where the perovskite oxide thin film is a (111) oriented film.

Figure 3:
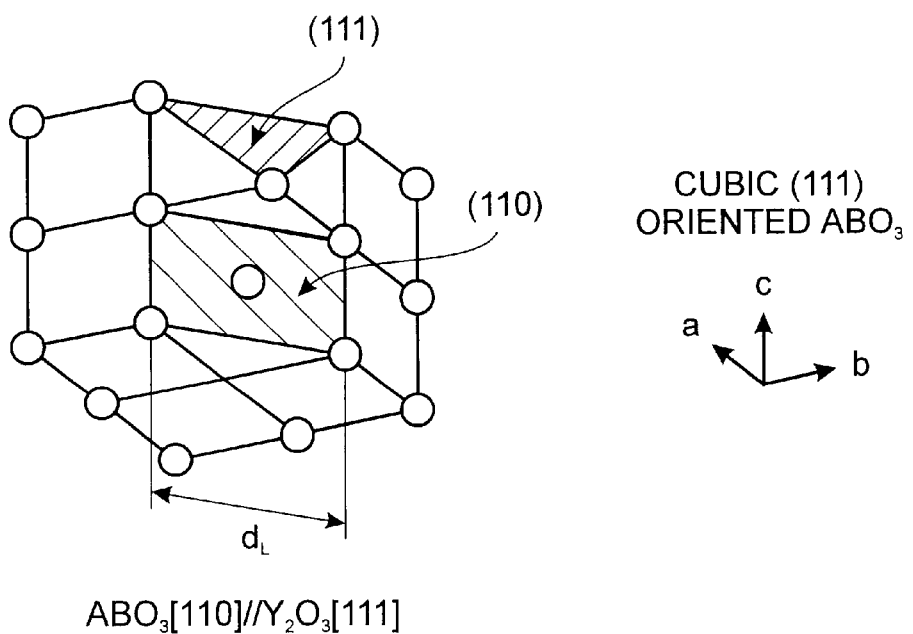
FIG. 3 is a schematic depicting an $ABO_3$ type perovskite crystal that is converted to a (111) oriented film upon growth on the {111} facet plane.

When the length $d_L$ of a long side of the cubic $ABO_3$ (110) face shown in FIG. 3 matches with twice (2d) as long as the lattice spacing d of the {111} facet plane in FIG. 1A, the $ABO_3$ {110} face is substantially parallel to the {111} facet plane during growth. FIG. 3 is the same as FIG. 1B in that the {110} face is substantially parallel to the facet plane. In the FIG. 3 case, however, the lattice shown in FIG. 1B grows while it topples down sidelong. In the $ABO_3$ thin film after growth, the (111) face is kept substantially parallel to the surface of the substrate. Usually, the thus formed $ABO_3$ thin film shows only a (nnn) peak upon x-ray diffraction. Consequently, the $ABO_3$ thin film is considered to be of (111) unidirectional orientation. However, this thin film may have a domain structure. When the ferroelectricity of the perovskite oxide thin film is utilized, it is preferable to grow the perovskite oxide thin film as depicted in FIG. 3 and allow it to change to a rhombohedral crystal after growth, because the rhombohedral (111) orientation is obtained along the axis of polarization. Even when the perovskite oxide thin film changes to tetragonal (111) after growth, it can function as a ferroelectric film because the component of the tetragonal [001] direction that is the axis of polarization can be used.

Whether the growing perovskite oxide thin film is of (100) orientation, (001) orientation, (010) orientation, or (111) orientation depends primarily on a lattice constant misfit between the perovskite oxide and the buffer layer. For instance, $PbTiO_3$ tends to provide a thin film of (001) orientation while PZT tends to provide a thin film of (111) orientation. However, it is possible to obtain the desired crystal orientation by a choice of substituent element.

Buffer Layer

Next, the buffer layer is explained in detail.

In the buffer layer, no special limitation is imposed on the size of the facet plane. However, when the height of the facet plane, i.e., the size of the facet plane upon projection on a plane perpendicular to the in-plane of the buffer layer is too small, the effect of the facet plane provided on the surface of the buffer layer becomes slender. It is thus preferable that the size upon projection is at least 5 nm. When the size upon projection is large, on the other hand, it is required to male the perovskite oxide thin film thick correspondingly. Without this, it is impossible to make the surface of the thin film flat. However, the increase in the thickness of the perovskite oxide thin film often results in the occurrence of cracks. It is thus preferable that the size upon projection is up to 30 nm. It is here noted that this size upon projection may be found from a transmission electron microscope photograph of a section of the buffer layer.

The ratio of the facet plane relative to the aforesaid interface is preferably at least 80%, and more preferably at least 90%. When this ratio of the facet plane is too low, it is difficult to grow the perovskite oxide thin film as an epitaxial layer of good quality. The ratio of the facet plane referred to herein is an area ratio found from a transmission electron microscope photograph of a section of the buffer layer as follows. Let B stand for the length of the region of the surface of the buffer layer to be measured (the length in the in-plane direction) and H represent the total length of the surface parallel to the in-plane direction (other than the facet plane). Then, the aforesaid ratio is given by: $[1-(H/B)^2]$. It is here noted that the length B of the region to be measured should be at least 1 $\mu$m.

To form the {111} facet plane on the surface of the buffer layer, the buffer layer should preferably contain as a main component a rare earth element oxide, zirconium oxide, or a zirconium oxide wherein a part of Zr is substituted by a rare earth element or an alkaline earth element. It is here noted that the rare earth element referred to herein should include Sc, and Y. When such a buffer layer is of cubic (100) orientation, tetragonal (001) orientation, or monoclinic (001) orientation, the facet plane can appear on its surface.

Here let R stand for a rare earth element, and an alkaline earth element. Then, the buffer layer can have a composition as represented by $Zr_{1-x}R_xO_{2-\delta}$. Zirconium oxide ($ZrO_2$) where x=0 undergoes a cubic→tetragonal→monoclinic phase transition from high temperature down to room temperature. However, the cubic crystal system is stabilized by the addition of the rare earth element or alkaline earth element. An oxide comprising $ZrO_2$ with a rare earth element or alkaline earth element added thereto is generally called stabilized zirconia. In the invention, it is preferable to use the rare earth element as the element for the stabilization of $ZrO_2$.

In the invention, no particular limitation is imposed on x in $Zr_{1-x}R_xO_{2-\delta}$ provided that the facet plane can be formed. As reported in Jpn. J. Appl. Phys. 27(8)L1404–L1405 (1988), however, rare earth element-stabilized zirconia appears as a tetragonal or monoclinic crystal in a composition region where x<0.2. In addition, J. Appl. Phys. 58(6) 2407–2409 (1985) reports that in a composition region where the stabilized zirconia appears as a tetragonal or monoclinic crystal, no unidirectionally oriented epitaxial film is obtainable because an oriented face other than the desired one is incorporated therein. As a result of study after study, the inventors have found that the evaporation process to be described later enables epitaxial growth to occur even in a composition region where x<0.2, resulting in good crystallinity. A high-purity $ZrO_2$ film, because of having high insulation resistance and being capable of reducing leakage current, is preferable in applications where insulting properties are needed. To make the formation of the facet plane easy, however, it is preferable that x>0.2.

When the buffer layer is formed while it is in contact with an Si single crystal substrate, on the other hand, it appears as a cubic crystal in a composition region where x exceeds 0.75. However, it is difficult to obtain (100) unidirectional orientation, resulting in the incorporation of a (111) oriented crystal, or (111) unidirectional orientation. When the buffer layer is formed directly on the Si single crystal substrate, therefore, it is preferable that $x \leq 0.75$, and especially $x \leq 0.50$ in $Zr_{1-x}R_xO_{2-\delta}$.

Even when the value of x is large, it is possible to allow the buffer layer to be of cubic (100) unidirectional orientation by forming the buffer layer on the Si single crystal substrate with a suitable primer or subbing layer interleaved between them. For such a primer layer it is preferable to use a thin film comprising zirconium oxide or stabilized zirconia and having cubic (100) orientation, tetragonal (001) orientation, or monoclinic (001) orientation. In the primer layer, x is set at a value smaller than that of x in the buffer layer.

The rare earth element contained in the stabilized zirconia thin film should preferably be chosen depending on the lattice constant of the thin film or substrate in contact with the stabilized zirconia thin film, so that the lattice constant of the thin film or substrate can match with that of the stabilized zirconia thin film. If x is varied while the type of the rare earth element is fixed, it is then possible to vary the lattice constant of stabilized zirconia, but matching-controllable region becomes narrow only by alteration of x. However, alteration of the rare earth element makes it possible to alter the lattice constant relatively largely, so that matching can be easily optimized. For instance, if Pr is used in place of Y, then the lattice constant can be increased.

It is here noted that an oxygen defect-free zirconium oxide is represented by the chemical formula: $ZrO_2$. However, the amount of oxygen in stabilized zirconia varies depending on the type, amount, and valence of the stabilizing element added, thereto, so that $\delta$ in $Zr_{1-x}R_xO_{2-\delta}$ can be in the range of 0 to 1.0, and usually 0 to 0.5.

The buffer layer may have a composition gradient structure where the composition changes continuously or stepwise. In the composition gradient structure, it is preferable that x in $Zr_{1-x}R_xO_{2-\delta}$ increases from the back side toward the surface side (metal thin film side) of the buffer layer. When the aforesaid primer layer is provided, the primer layer may be regarded as being a part of the buffer layer. In other words, the buffer layer is said to have a stepwise varying composition.

The rare earth element used for the buffer layer may be at least one element selected from the group consisting of Sc, Y, Ce, Pr, Nd, Sm, Eu, Gd, Tb, Dy, Ho, Er, Tm, Yb, and Lu. However, it is preferable to select from these elements an element that provides a stable cubic oxide because some rare earth element oxides are likely to have a hexagonal rare earth a type structure. More specifically, at least one element selected from the group consisting of Sc, Y, Ce, Eu, Gd, Tb, Dy, Ho, Er, Tm, Yb, and Lu is preferred. An appropriate selection should be made from these elements depending on the lattice constant of the oxide of each element, and other conditions.

To improve the properties of the buffer layer, some additives may be added thereto. For instance, Al, and Si are effective for film resistivity improvements. Furthermore, transition metal elements such as Mn, Fe, Co, and Ni make it possible to create a level due to impurities (trap level) in the film. By use of this level, it is possible to gain conductivity control.

It is here understood that in the $ZrO_2$ thin film used as the primer or buffer layer, the upper limit to the ratio of Zr is now of the order of 99.99 mol %. With state-of-the-art ultra-purifying techniques, it is still difficult to separate $ZrO_2$ from $HfO_2$. Thus, the purity of $ZrO_2$ generally refers to a purity on Z+Hf basis. Accordingly, the purity of $ZrO_2$ referred to herein is a value found on the assumption that Hf and Zr can be regarded as being the same element. However, there is no problem at all because $HfO_2$ functions in much the same manner as $ZrO_2$ in the $ZrO_2$ thin film according to the invention. The same also holds for the aforesaid stabilized zirconia.

No particular limitation is placed on the thickness of the buffer layer; the buffer layer may have a suitable thickness determined in such a manner that the facet plane of proper size can be formed. However, the buffer layer should preferably have a thickness of 5 to 1,000 nm, and especially 25 to 100 nm. Too thin a buffer layer makes it difficult to form a homogeneous facet plane thereon, and too thick a buffer layer often induces cracks therein. The primer layer, too, may have a suitable thickness determined in such a manner that the primer layer is in the form of a homogeneous epitaxial film having a flat surface with no cracks therein. Usually, however, the primer layer should have a thickness of 2 to 50 nm.

Perovskite Oxide Thin Film

No particular limitation is placed on materials used for the perovskite oxide thin film; a suitable material may be selected depending on the functions demanded therefor, e.g., ferroelectricity, and piezoelectricity. For instance, the following materials are preferred in the invention.

Preferred for the invention are simple, composite, and layer perovskite compounds including $BaTiO_3$; a Pb family of perovskite compounds such as $PbTiO_3$, a rare earth element-containing lead titanate, PZT (lead zirconate titanate), and PLZT (lead lanthanum zirconate titanate); and a Bi family of perovskite compounds.

Of the aforesaid perovskite materials, $BaTiO_3$, and a lead family of perovskite compounds such as $PbTiO_3$ are generally represented by the chemical formula: $ABO_3$ wherein A and B are each a cation. Letter A should preferably be at least one member selected from the group consisting of Ca, Ba, Sr, Pb, K, Na, Li, La, and Cd, and B should preferably be at least one member selected from the group consisting of Ti, Zr, Ta, and Nb. In the first embodiment of the invention, a member or members showing function properties such as ferroelectricity at the service temperature may properly be selected from these compounds depending on purpose.

In such perovskite compounds, the ratio A/B should preferably be 0.8 to 1.3, and especially 0.9 to 1.2.

By limiting the ratio A/B to such a range, it is possible to ensure the insulating properties of the dielectric material and improve the crystallinity of the dielectric material and, hence, improve the dielectric and ferroelectric properties of the dielectric material. No crystallinity improvement is expected at an A/B ratio of less than 0.8 whereas an A/B ratio exceeding 1.3 makes the formation of a homogeneous thin film difficult. Such an A/B ratio is achieved by control of film deposition conditions.

Although the ratio x of oxygen in $ABO_x$ is described herein as having a value of 3 as in $PbTiO_3$, the value of x is not always limited to 3. Some perovskite materials form a stable perovskite structure even when they have oxygen defects or contain excessive oxygen. In $ABO_x$, the value of x is generally in the range of about 2.7 to about 3.3. It is understood that the A/B ratio may be determined by x-ray fluorescence analysis.

The $ABO_3$ type perovskite compound used herein may be any one of $A^{1+}B^{5+}O_3$, $A^{2+}B^{4+}O_3$, $A^{3+}B^{3+}O_3$, $A_xBO_3$, $A(B'_{0.67}B''_{0.33})O_3$, $A(B'_{0.33}B''_{0.67})O_3$, $A(B_{0.5}^{+3}B_{0.5}^{+5})O_3$, $A(B_{0.5}{}^{2+}B_{0.5}{}^{6+})O_3$, $A(B_{0.5}{}^{1+}B_{0.5}{}^{7+})O_3$, $A^{3+}(B_{0.5}{}^{2+}B_{0.5}{}^{4+})O_3$, $A(B_{0.25}{}^{1+}B_{0.75}{}^{5+})O_3$, $A(B_{0.5}{}^{3+}B_{0.5}{}^{4+})O_{2.75}$, and $A(B_{0.5}{}^{2+}B_{0.5}{}^{5+})O_{2.75}$.

More illustratively, a Pb family of perovskite compounds such as PZT, and PLZT, $CaTiO_3$, $BaTiO_3$, $PbTiO_3$, $KTaO_3$, $BiFeO_3$, $NaTaO_3$, $SrTiO_3$, $CdTiO_3$, $KNbO_3$, $LiNbO_3$, $LiTaO_3$, and solid solutions thereof are mentioned.

It is understood that the aforesaid PZT is a $PbZrO_3$—$PbTiO_3$ base solid solution wherein the molar ratio $PbTiO_3$:$PbZrO_3$ may be properly determined depending on the requirements. Generally, PZT tends to appear as a tetragonal crystal on a $PbTiO_3$-enriched side and to appear as a rhombohedral crystal on a $PbZrO_3$-enriched side. It is also understood that the aforesaid PLZT is a compound comprising PZT doped with La and, in $ABO_3$ parlance, is represented by $(Pb_{0.89\sim0.91}La_{0.11\sim0.09})(Zr_{0.65}Ti_{0.35})O_3$, for instance.

Of the layer perovskite compounds, the Bi family of layer compounds are generally represented by the formula:

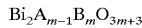
$$Bi_2A_{m-1}B_mO_{3m+3}$$

where m is an integer of 1 to 5, A is any one of Bi, Ca, Sr, Ba, Pb, and a rare earth element (including Sc, and Y), and B is any one of Ti, Ta, and Nb. More illustratively, $Bi_4Ti_3O_{12}$, $SrBi_2Ta_2O_9$, and $SrBi_2Nb_2O_9$ are mentioned. In the first embodiment of the invention, any one of these compounds or solid solutions thereof may be used.

It is understood that the lattice constants of the composite perovskite compounds (including the layer perovskite compounds) themselves are an integral multiple of their unit lattice (usually approximately 5 times at most). In the first embodiment of the invention, the lattice constant of a perovskite oxide is of relatively great significance. In the composite perovskite compound, however, the lattice constant of its unit lattice is of importance. In a compound having a pseudo-perovskite structure upon formed to a thin film, e.g., $SrRuO_3$, the lattice constant of the compound in a pseudo-perovskite state rather than the lattice constant of a crystallographic structure in a bulk state is of importance.

Preferred perovskite compounds used herein are titanates or titanate-containing perovskite compounds, e.g., $BaTiO_3$, $SrTiO_3$, PLZT, PZT, $CaTiO_3$, $PbTiO_3$, and rare earth element-containing lead titanates. More preferred are $BaTiO_3$, $SrTiO_3$, PZT, $PbTiO_3$, and rare earth element-containing lead titanates, and most preferred are $PbTiO_3$, and rare earth element-containing lead titanates containing R, Pb, Ti, and O wherein R is at least one rare earth element selected from the group consisting of Pr, Nd, Eu, Tb, Dy, Ho, Yb, Y, Sm, Gd, Er, and La). $PbTiO_3$ in particular is best suited for memories in view of spontaneous polarization, dielectric constant, and Curie point.

Preferably, the rare earth element-containing lead titanate has a composition wherein the ratios of constituent elements fall in the range:

$0.8 \leq (Pb+R)/Ti \leq 1.3$ $0.5 \leq Pb/(Pb+R) \leq 0.99$, and especially $0.9 \leq (Pb+R)/Ti \leq 1.2$ $0.7 \leq Pb/(Pb+R) \leq 0.97$ The rare earth element-containing lead titanate of this composition is disclosed in JP-A 8-186625. By adding the rare earth element to $PbTiO_3$ at the above-defined ratio, Ec can be reduced while suppressing the reduction of remnant polarization Pr which is otherwise caused by the addition of the rare earth element. Since the rare earth element which is unlikely to form a semiconductor is added to the aforesaid composition, it is possible to achieve a perovskite oxide thin film less susceptible to leakage. The inventors have also found that the type, and amount of the rare earth element added has an influence on the fatigue property of polarization reversal. Since the type, and amount of the rare earth element added are optimized in the above-mentioned composition, it is possible to achieve a perovskite oxide thin film having an improved fatigue life.

R substitutes for Pb at A site of the basic perovskite structure of $PbTiO_3$ material with the result that crystals are deformed. $PbTiO_3$ has a tetragonal system perovskite structure having an a axis of 0.3897 nm and a c axis of 0.4147 nm, with an axis of polarization in the c axis direction. With this crystal deformation the a to c axis ratio is reduced with a slight reduction of spontaneous polarization, so that the voltage (Ec) required for polarization reversal can be lowered. On the other hand, a rare earth element other than R, e.g., Ce is not preferable for device applications, because it substitutes for an element at B site of $PbTiO_3$ with the result that spontaneous polarization drops extremely due to ineffective crystal deformation.

In general, lead titanate contains Pb, Ti, and O at an atomic ratio of Pb:Ti:O=1:1:3. In the first embodiment of the invention, the ratio of oxygen varies depending on the type, and amount of R added, and is usually in the range of about 2.7 to about 3.3.

In the rare earth element-containing lead titanate, up to 60 at % of Ti may be substituted by at least one of Zr, Nb, Ta, Hf, and Ce.

While the invention has been explained chiefly with reference to the perovskite oxide having ferroelectricity, it is understood that a conductive perovskite oxide may also be used in the first embodiment of the invention. The conductive perovskite oxide thin film may be used as, for instance, an electrode layer in an electronic device.

Set out below are examples of the conductive perovskite oxide.

$ReO_3$, $WO_3$, $M_xReO_3$ where M is a metal and $0<x<0.5$), $M_xWO_3$ where N is a metal and $0<x<0.5$, $A_2P_8W_{32}O_{112}$ where A is K, Rb, and Tl), $Na_xTa_yW_{1-y}O_3$ where $0 \leq x<1$ and $0<y<1$, $RNbO_3$ where R is at least one rare earth element (including Sc, and Y), $Na_{1-x}Sr_xNbO_3$ where $0 \leq x \leq 1$, $RTiO_3$ where R is at least one rare earth element including Sc, and Y, $Ca_{n+1}Ti_nO_{3n+1-y}$ where n=2, 3, etc. and y>0, $CaVO_3$, $SrVO_3$, $R_{1-x}Sr_xVO_3$ where R is at least one rare earth element including Sc, and Y and $0 \leq x \leq 1$, $R_{1-x}Ba_xVO_3$ where R is at least one rare earth element including Sc, and Y and $0 \leq x \leq 1$, $Sr_{n+1}V_nO_{3n+1-y}$ where n=1, 2, 3, etc. and y>0, $Ba_{n+1}V_nO_{3n+1-y}$ where n=1, 2, 3, etc. and y>0, $R_4BaCu_5O_{13-y}$ where R is at least one rare earth element including Sc, and Y and $0 \leq y$), $R_5SrCu_6O_{15}$ where R is at least one rare earth element including Sc, and Y, $R_2SrCu_2O_{6.2}$ where R is at least one rare earth element including Sc, and Y, $R_{1-x}Sr_xVO_3$ where R is at least one rare earth element including Sc, and Y, $CaCrO_3$, $SrCrO_3$, $RM_nO_3$ where R is at least one rare earth element including Sc, and Y, $R_{1-x}Sr_xMnO_3$ where R is at least one rare earth element including Sc, and Y and $0 \leq x \leq 1$, $R_{1-x}Ba_xMnO_3$ where R is at least one rare earth element including Sc, and Y and $0 \leq x \leq 1$, $Ca_{1-x}R_xMnO_{3-y}$ where R is at least one rare earth element including Sc, and Y, $0 \leq x \leq 1$ and $0 \leq y$, $CaFeO_3$, $SrFeO_3$, $BaFeO_3$, $SrCoO_3$, $BaCoO_3$, $RCoO_3$ where R is at least one rare earth element including Sc, and Y, $R_{1-x}Sr_xCoO_3$ where R is at least one rare earth element including Sc, and Y and $0 \leq x \leq 1$, $R_{1-x}Ba_xCoO_3$ where R is at least one rare earth element including Sc, and Y and $0 \leq x \leq 1$, $RNiO_3$ where R is at least one rare earth element including Sc, and Y, $RCuO_3$ where R is at least one rare earth element including Sc, and Y, $RNbO_3$ where R is at least one rare earth element including Sc, and Y, $Nb_{12}O_{29}$, $CaRuO_3$, $Ca_{1-x}R_xRu_{1-y}MnO_3$ where R is at least one rare earth element including Sc, and Y, $0 \leq x \leq 1$ and $0 \leq y \leq 1$, $SrRuO_3$, $Ca_{1-x}Mg_xRuO_3$ where $0 \leq x \leq 1$, $Ca_{1-x}Sr_xRuO_3$ where $0<x<1$, $BaRuO_3$, $Ca_{1-x}Ba_xRuO_3$ where $0<x<1$, $(Ba, Sr)RuO_3$, $Ba_{1-x}K_xRuO_3$ where $0<x \leq 1$, $(R, Na)RuO_3$ where R is at least one rare earth element including Sc, and Y, $(R, M)RhO_3$ where R is at least one rare earth element including Sc, and Y and M is Ca, Sr, and Ba, $SrIrO_3$, $BaPbO_3$, $(Ba, Sr)PbO_{3-y}$ where $0 \leq y \leq 1$, $BaPb_{-x}Bi_xO_3$ where $0<x \leq 1$, $Ba_{1-x}K_xBiO_3$ where $0<x \leq 1$, $Sr(Pb, Sb)O_{3-y}$ where $0 \leq y<1$, $Ba(Pb, Sb)O_{3-y}$ where $0 \leq y<1$, $Ba(Pb, Bi)O_{3-y}$ where $0 \leq y<1$, $MMoO_3$ where M is Ca, Sr, and Ba, $(Ba, Ca, Sr)TiO_{3-x}$ where $0 \leq x$, etc.

The layer perovskite oxide (including $K_2NiF_4$ type), for instance, includes $R_{n+1}Ni_nO_{3n+1}$ where R is at least one of Ba, Sr, and a rare earth element including Sc, and Y, and n is an integer of 1 to 5, $R_{n+1}Cu_nO_{3n+1}$ where R is at least one of Ba, Sr, and a rare earth element including Sc, and Y, and n is an integer of 1 to 5, $Sr_2RuO_4$, $Sr_2RhO_4$, $Ba_2RuO_4$, and $Ba_2RhO_4$.

Of these compounds, particular preference is given to $RCoO_3$, $RMnO_3$, $RNiO_3$, $R_2CuO_4$, $(R, Sr)CoO_3$, $(R, Sr, Ca)RuO_3$, $(R, Sr)RuO_3$, $SrRuO_3$, and $(R, Sr)MnO_3$ where R is at least one rare earth element including Sc, and Y as well as their related compounds.

The thickness of the perovskite oxide thin film varies depending on what purpose it is used for, and is preferably in the range of 10 to 500 nm, and especially 50 to 150 nm. In other words, the perovskite oxide thin film should preferably be thin to such an extent that its crystallinity and surface flatness are not adversely affected. More illustratively, the perovskite oxide thin film should preferably be of at least 30 nm in thickness so as to level asperities formed by the facet planes of the buffer layer. At a thickness of 100 nm or more good-enough surface flatness is obtainable.

Crsytallinity, and Surface Flatness

The crystallinity of the buffer layer, perovskite oxide thin film, and primer layer may be estimated in terms of the half-width of a rocking curve of reflection peak in XRD (x-ray diffractometry) and the pattern of an RHEED image. The surface flatness may be estimated in terms of the pattern of an RHEED image, and under a transmission electron microscope. It is here noted that the "RHEED" is an abbreviation of reflection high energy electron diffraction.

Referring here to the crystallinity of the buffer layer, and primer layer, the buffer layer should preferably have such crystallinity that the rocking curve of reflection at the (200) or (002) face (at the (400) face in a buffer layer of the rare earth c type structure) upon x-ray diffraction has a half-width of up to 1.50°, and the perovskite oxide thin film should preferably such crystallinity that the rocking curve of reflection at the (111) face in the case of (111) orientation, for instance, has a half-width of up to 1.50° upon x-ray diffraction. While there is no particular upper limit to the half-width of a rocking curve, it is understood that the smaller, the better. However, the possible lowest half-width value is now of the order of 0.7° in general, and 0.4° in particular. A spotty RHEED image indicates that there are asperities on the surface while a streaky RHEED image indicates that there is a flat surface. In either case, a sharp RHEED images implies that excellent crystallinity is achieved.

In the multilayer thin film of the first embodiment of the invention, the buffer layer, and primer layer should preferably be an epitaxial layer. It is first required that the epitaxial layer referred to herein be a unidirectionally oriented film. By the term "unidirectionally oriented film" used herein is intended a film in which the peak intensity of reflection at a face other than the desired face is 10% or less, and preferably 5% or less of the maximum peak intensity of reflection at the desired face. Referring to a (k00) unidirectionally oriented film, i.e., an a-face unidirectionally oriented film as an example, the peak intensity of reflection at a face other than the (k00) face upon 2θ-θ x-ray diffraction of the film is 10% or less, and preferably 5% or less of the maximum peak intensity of reflection at the (k00) face. In the present disclosure, the index (k00) is understood to refer collectively to a (100) family of faces, that is, equivalent faces such as (100), and (200) faces. The second requirement for the epitaxial film referred to herein is that when an x-y plane represents an in-plane direction and a z axis represents a film thickness direction, crystals be all well oriented in the x, y, and z axis directions. Such orientation may be confirmed by the fact that the epitaxial film shows a spotty or streaky sharp pattern upon RHEED estimation. For instance, when there is a misalignment in the crystal orientation in the buffer layer having surface asperities, the RHEED image tends to extend in a ring form rather than to take a sharp spotty form. If a certain film meets the aforesaid two requirements, it can then be said to be an epitaxial film.

In the first embodiment of the invention, the perovskite oxide thin film can take the form of an epitaxial film.

Substrate

The substrate used in the first embodiment of the invention may be selected from various single crystal substrates such as Si, MgO, and $SrTiO_3$ substrates. However, the most preferable substrate is one having an Si (100) single crystal face.

Fabrication Process

No particular limitation is imposed on how to fabricate the buffer layer, perovskite oxide thin film, and primer layer; an appropriate selection may be made from processes capable of forming these on a substrate, and especially on an Si single crystal substrate, each in the form of an epitaxial film. However, it is preferable to use an evaporation process, and especially one disclosed in the aforesaid JP-A 10-223476.

In what follows, the formation of a buffer layer comprising stabilized zirconia will be explained with reference to a typical example of fabrication process.

Figure 14:
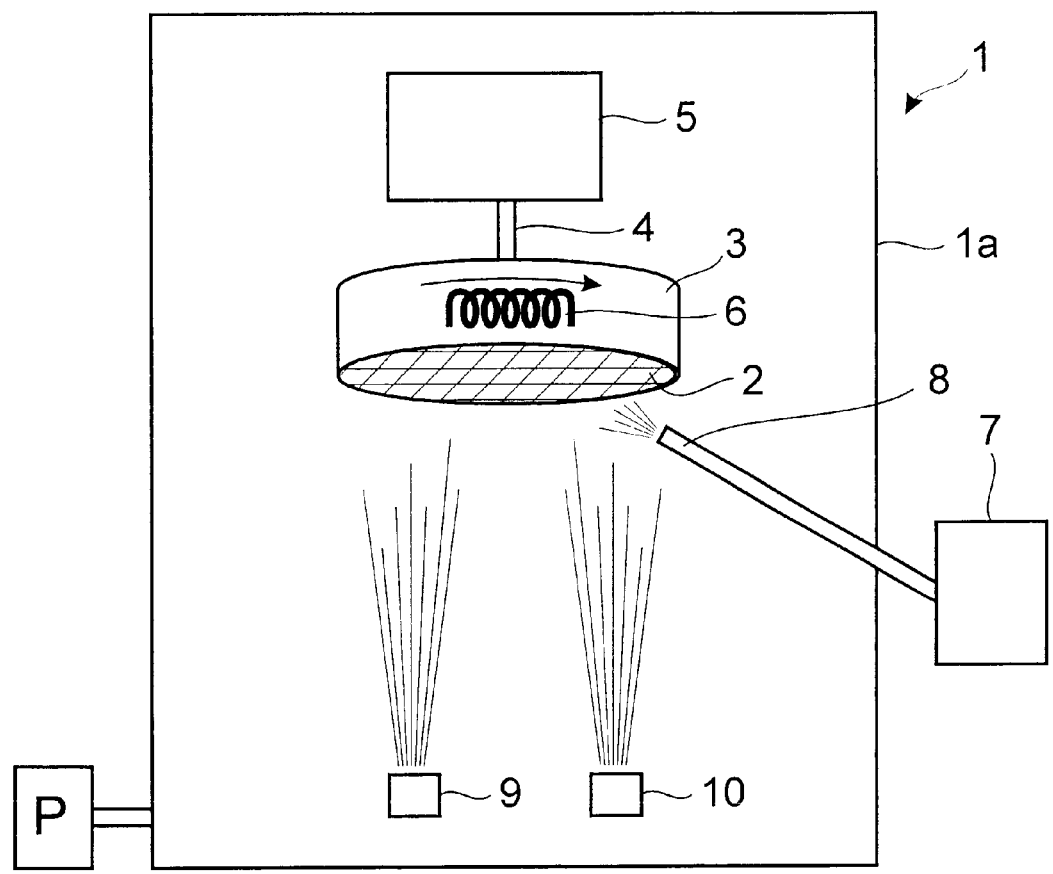
FIG. 14 is a view in schematic form depicting one example of the evaporation system used for the formation of the multilayer thin film according to the invention.

In the practice of this fabrication process, it is desired to rely upon an evaporation system built up as typically shown in FIG. 14.

This evaporation system 1 includes a vacuum chamber 1a provided with a vacuum pump P, wherein a holder 3 for supporting a substrate 2 is positioned at a lower part thereof. This holder 3 is connected to a motor 5 via a rotating shaft 4, so that it can be rotated by the motor 5 to rotate the substrate 2 within its surface. The holder 3 includes a built-in heater 6 for heating the substrate 2.

The evaporation system 1 further includes an oxidizing gas feeder 7 with a nozzle 8 located just below the holder 3, thereby increasing the partial pressure of an oxidizing gas in the vicinity of the substrate 2. Further below the holder 3 there are a Zr evaporation section 9 and a rare earth element evaporation section 10. Each evaporation section includes, in addition to its evaporation source, an energy feeder (an electron beam generator or resistive heater) for feeding an amount of energy for evaporation.

First, the substrate is set on the holder. With this fabrication process, a homogeneous thin film can be formed on a large-area substrate, for instance, a substrate having an area of 10 cm$^2$ or larger, and so an electronic device including a multilayer thin film can be obtained at a much lower cost than achieved in the prior art. While no upper limit is placed to the area of the substrate, it is understood that the possible largest area is now of the order of 400 cm$^2$. The invention may be applied to semiconductor processes which are currently in vogue and use an Si wafer of 2 to 8 inches in general, and an Si wafer of 6 inches in particular. It is also possible to form a multilayer thin film on a selected portion of a wafer through a mask rather than all over the wafer.

When the Si single crystal substrate is used in the invention, it is preferable to apply surface treatment to the substrate prior to the formation of the buffer layer thereon. To this end, for instance, it is preferable to make use of the surface treatments disclosed in the aforesaid JP-A 9-110592, and JP-A 10-287494 published under the name of the applicant.

By such surface treatment, Si crystals on the surface of the substrate are coated and protected with an Si oxide layer. Then, the Si oxide layer is reduced and removed by a metal fed on the surface of the substrate to form the buffer layer, e.g., Zr.

Next, while the substrate is heated in vacuo, the rare earth element and Zr are fed together with the oxidizing gas to the surface of the substrate, thereby growing the buffer layer thereon. The heating temperature may be appropriately determined such that the facet plane is formed with good crystallinity. More illustratively, heating should be carried out at 400° C. or higher for crystallization. At 750° C. or higher, there is obtained a film excellent in crystallinity. The size of the facet plane may be controlled by the heating temperature. The upper limit to the heating temperature is usually about 1,300° C. although varying with the heat resistance of the substrate. As the oxidizing gas, any one of oxygen, ozone, atomic oxygen, NO$_2$, radical oxygen or the like gas may be used. In the following explanation, oxygen is used as the oxidizing gas.

To form the buffer layer, the oxygen gas is continuously fed into the vacuum evaporation chamber while the vacuum evaporation chamber is continuously evacuated by means of the vacuum pump. The partial pressure of oxygen in the vicinity of the substrate should preferably be of the order of $10^{-3}$ to $10^{-1}$ Torr. In this regard, the upper limit to the partial pressure of oxygen must be $10^{-1}$ Torr so as to keep the rate of evaporation of the metal constant with no degradation of the metal in the evaporation source placed in the vacuum evaporation chamber. When the oxygen gas is introduced in the vacuum evaporation chamber, it is preferable to inject the oxygen gas from the vicinity of the surface of the substrate to the surface of the substrate, thereby establishing an atmosphere having a high oxygen partial pressure only in the vicinity of the substrate. This in turn makes it possible to promote the reaction occurring on the substrate with a more reduced amount of the gas introduced. At this time, the vacuum chamber is continuously evacuated, so that a substantial part of the vacuum chamber can be placed under a low pressure of $10^{-4}$ to $10^{-6}$ Torr. The rate of the oxygen gas fed should be preferably 2 to 50 cc/min., and more preferably 5 to 25 cc/min. By controlling the rate of the oxygen gas fed, the facet plane can be easily formed with an alteration of its size. The optimum rate of the oxygen gas fed is determined depending on the volume of the vacuum chamber, the evacuation rate of the vacuum pump, and other factors; the rate of the oxygen gas fed can be approximately predetermined.

Each evaporation source is heated and evaporated by electron beams or other suitable means so that the resulting vapor can be fed to the substrate. To provide a homogeneous thin film with the facet plane formed thereon, the film deposition rate should preferably be 0.05 to 1.00 nm/s, and especially 0.100 to 0.500 nm/s. By controlling the film deposition rate, the facet plane can be easily formed with an alteration of its size.

When the film is formed on an area of about 10 cm$^2$ or larger, for instance, on the surface of a substrate of 2 inches in diameter, the substrate is rotated as depicted in FIG. 14 to feed the oxygen gas uniformly all over the surface of the substrate, so that the oxidation reaction can be promoted all over the film deposition area. This then makes it possible to form a large-area yet homogeneous film. At this time, it is preferable that the substrate rotates at 10 rpm or faster. Slow rotation makes the distribution of film thickness likely to occur in the surface of the substrate. While there is no upper limit to the revolutions per minute of the substrate, it is understood that the upper limit is usually about 120 rpm by reason of the mechanism of the vacuum system.

A thin film comprising a rare earth element oxide or a thin film comprising zirconium oxide, too, may be formed in the same manner as in the aforesaid stabilized zirconia thin film. For instance, when a rare earth element oxide thin film is formed on a zirconium oxide thin film using the same rare earth element in both the thin films, the supply of Zr is interrupted at the time the zirconium oxide thin film reaches a given thickness, whereupon the rare earth element alone is fed, thereby forming both the thin films in a continuous manner. When the buffer layer is formed with a composition gradient structure, the amount of Zr fed is decreased gradually to zero, whereupon the rare earth element oxide thin film is formed.

As can be clearly seen from a comparison with conventional processes such as vacuum evaporation, sputtering, and laser abrasion processes, the fabrication process according to the invention can be carried out with no inclusion of impurities at all yet under easy-to-control operating conditions, and so is suitable for fabricating the end large-area product of high perfection in a reproducible fashion.

Even when this fabrication process is carried out with an MBE system, it is possible to obtain the end thin film in the same manner as mentioned above.

When the perovskite oxide thin film is formed, it is preferable to set the temperature of the substrate at 500 to 750° C. during evaporation. At too low a substrate temperature it is difficult to obtain a film of high crystallinity, whereas at too high a substrate temperature the resulting film is likely to vary in composition or have large asperities on the surface due to re-evaporation. It is here noted that if a trace amount of radical oxygen is introduced in the vacuum chamber during evaporation, it is then possible to reduce the re-evaporation of the raw material. For instance, this radical oxygen is effective for preventing the re-evaporation of Pb or PbO in a PbTiO$_3$ thin film.

Generally in the first embodiment of the invention, the perovskite oxide thin film has satisfactory surface flatness. In some cases, however, no sufficient surface flatness is obtainable although depending on the thickness of the thin film, and how to form the thin film. In such cases, the surface of the thin film can be made flat by polishing. To this end, chemical polishing using an alkaline solution, etc., and mechanical polishing using colloidal silica, etc. may be carried out singly or in combination. It is here noted that a distortion often remains in the surface of the multilayer thin film upon polishing. When it is necessary to remove such a distortion upon polishing, it is preferable to anneal the multilayer thin film. Annealing should be carried out preferably at 300 to 850° C. for 1 second to 30 minutes, and more preferably at 400 to 750° C. for 5 to 15 minutes.

Second Embodiment

In the second embodiment of the invention, the buffer layer is located between the metal thin film and the substrate. It is here noted that the buffer layer also functions as an insulator.

Figure 4A:
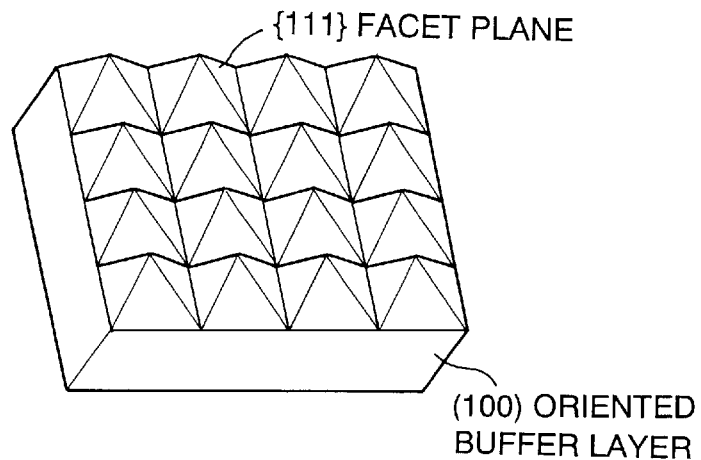
FIG. 4A is a schematic of the {111} facet plane of the buffer layer surface.
Figure 4B:
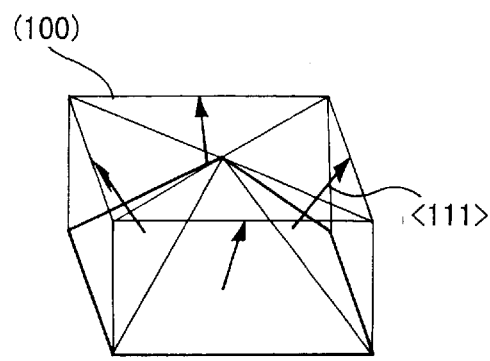
FIG. 4B is an exaggerated view thereof.
Figure 4C:
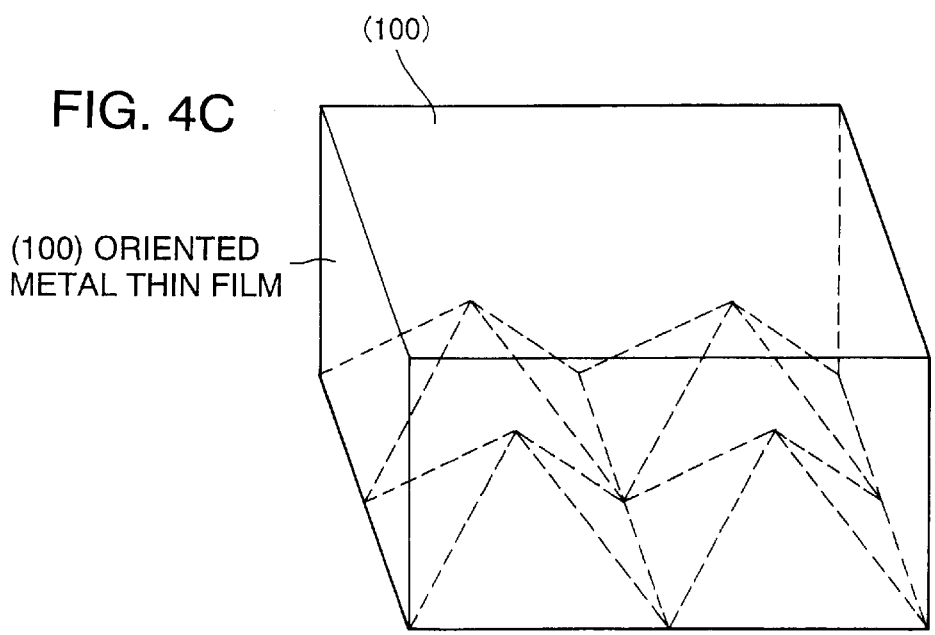
FIG. 4C is a schematic illustrative of a metal thin film formed on this facet plane.

The buffer layer according to this embodiment is characterized in that the interface between the buffer layer and the metal thin film includes a {111} facet plane. FIG. 4A is a schematic view depicting the facet planes on the surface of the buffer layer, and FIG. 4B is an exaggerated view of some facet planes. The buffer layer according to the second embodiment is the same as that according to the first embodiment, and is an epitaxial film of cubic (100) orientation, tetragonal (001) orientation or monoclinic (001) orientation; that is, the facet plane is the {111} facet plane. The metal thin film, in a {111} oriented film form, grows epitaxially on the {111} facet planes of the buffer layer. As the metal thin film grows, depressions defined by the facet planes are filled up. Finally, the surface of the metal thin film becomes flat and parallel to the surface of the substrate, as depicted in FIG. 4C. Although this surface is usually defined by the cubic (100) face, it is understood that the surface often appears as the tetragonal (001) face due to the distortion of crystal lattices, etc.

Never until now is it reported that when a metal thin film comprising a metal appearing in a cubic crystal form is formed on the facet planes present on the surface of the buffer layer, this metal thin film is formed as an epitaxial film of cubic (100) orientation; the invention is the first to find this fact. While it has so far been known that the $ZrO_2$ thin film or rare earth element oxide thin film may be used as the buffer layer, as previously stated, it is understood that when a metal thin film is formed directly on a flat buffer layer, any good-quality epitaxial film of cubic (100) orientation is not obtained.

Buffer Layer

As noted just above, the same buffer layer as in the first embodiment is used in the second embodiment.

Metal Thin Film

Reference is now made to why the metal thin film is provided. When the multilayer thin film according to this embodiment is used as an electronic device-constituting element, the metal thin film functions primarily as an electrode. If a piezoelectric thin film or the like serving as a function film is formed on a metal thin film of excellent crystallinity and surface flatness, obtained according to this embodiment, it is then possible to achieve various electronic devices of good performance, e.g., a thin-film bulk resonator. For light-emitting devices such as LEDs, and laser diodes, it is of importance to achieve high luminance. If the function of reflecting emitted light is incorporated in a device, high luminance can then be easily achieved. For instance, if a thin film acting as a reflective layer is located at a suitable position in the device, it is then possible to foster a release of light emitted out of the device. The metal thin film according to this embodiment, too, may function as such a reflective layer. In addition, the metal thin film serves as an absorber for absorbing stresses in the multilayer thin film, and so has an effect on prevention of cracks which may otherwise occur in a thin film formed on the metal thin film.

The metal thin film formed on the surface of the buffer layer with facet planes present thereon grows while filling up the depressions defined by the facet planes, as previously stated and, finally, the surface of the metal thin film becomes flat and parallel to the surface of the substrate. At this time, the metal thin film appears usually as a cubic epitaxial film with the (100) face oriented parallel to the film surface. In some cases, however, this metal thin film appears as an epitaxial film of tetragonal (001) orientation, for example, because of the deformation of crystals by reason of stresses.

The metal thin film should preferably be composed mainly of at least one metal selected from the group consisting of Pt, Ir, Pd, and Rh. These metals are preferably used singly or in an alloy form. The metal thin film may also be made up of two or more thin films varying in composition.

The metal thin film should preferably have a thickness of 10 to 500 nm, and especially 50 to 150 nm although varying depending on what purpose it is used for. In other words, this metal thin film should preferably be thin enough to have no adverse influence on its crystallinity, and surface flatness. More illustratively, the metal thin film should preferably have a thickness of 30 nm or more so as to level asperities defined by the facet planes of the buffer layer. At a thickness of 100 nm or more satisfactory surface flatness is achievable. In order to allow the metal thin film to function well as an electrode, its thickness should preferably be in the range of 50 to 500 nm.

In this regard, the resistivity of the metal thin film should be prefereably $10^{-7}$ to $10^3$ Ωcm, and more preferably $10^{-7}$ to $10^{-2}$ Ωcm.

Crystallinity, and Surface Flatness

In the second embodiment of the invention, the buffer layer, and primer layer should preferably have the same crystallinity as in the first embodiment of the invention. Accordingly, the metal thin film, too, should preferably have the same crystallinity as is the case with the buffer layer, and primer layer. The crystallinity of the metal thin film may again be determined by the half-width of a rocking curve of reflection at the (200) or (002) face.

In the second embodiment of the invention, the metal thin film should preferably be an epitaxial film.

Substrate

In the second embodiment of the invention, the same substrate as in the first embodiment of the invention may be used. It is here noted that when an Si single crystal substrate is used, the substrate and multilayer thin film should preferably be such that their axes present within the surfaces are parallel to one another.

Fabrication Process

In the second embodiment of the invention, no particular limitation is imposed on how to fabricate the buffer layer, and primer layer; an appropriate selection may be made from processes capable of forming these on a substrate, and especially on an Si single crystal substrate, each in the form of an epitaxial film. However, it is preferable to use an evaporation process, and especially those disclosed in the aforesaid JP-A's 9-110592 and 10-287494. Otherwise stated, these layers should preferably be formed by the process explained with reference to the first embodiment of the invention.

Formation Process of Metal Thin Film

The metal thin film, too, should preferably be formed by the aforesaid process. When the metal thin film is formed by the evaporation process, it is preferable to set the temperature of the substrate at 500 to 750° C. during evaporation. At too low a substrate temperature it is difficult to obtain a film of high crystallinity, whereas at too high a substrate temperature the resulting film is likely to have large asperities on the surface. It is here noted that if a trace amount of oxygen is introduced together with Rf plasma in the vacuum chamber during evaporation, ever higher crystallinity is then achievable. For instance, this is effective for preventing the incorporation of (111) oriented crystals in the (100) oriented crystals of a Pt thin film.

Generally in the second embodiment of the invention, the metal thin film has satisfactory surface flatness. In some cases, however, no sufficient surface flatness is obtainable although depending on the thickness of the metal thin film, and how to form the metal thin film. In such cases, the surface of the thin film can be made flat by polishing. To this end, chemical polishing using an alkaline solution, etc., and mechanical polishing using colloidal silica, etc. may be carried out singly or in combination.

In this regard, it is noted that a distortion often remains in the surface of the multilayer thin film upon polishing. When it is necessary to remove such a distortion upon polishing, it is preferable to anneal the multilayer thin film. Annealing should be carried out preferably at 300 to 850° C. for 1 second to 30 minutes, and more preferably at 400 to 750° C. for 5 to 15 minutes.

Application of Multilayer Thin Film

According to the invention, a high-performance function film can be formed on an Si substrate. Consequently, the multilayer thin film of the invention is suitable for such various electronic devices as previously mentioned.

When the perovskite oxide thin film formed according to the first embodiment of the invention is used as an electrode film in an electronic device, various function films are usually provided thereon. When the perovskite oxide thin film formed according to the first embodiment of the invention is utilized as various function films, an electrode layer is usually provided thereon. For the metal formed as an electrode layer on the perovskite oxide thin film, Au, Pt, Ir, Os, Re, Pd, Rh and Ru should preferably be used singly or in an alloy form.

EXAMPLE

Example 1 (First Embodiment)

A multilayer thin film comprising a $ZrO_2$ thin film, a $Y_2O_3$ thin film, and a $PbTiO_3$ thin film stacked on an Si (100) single crystal substrate in this order was prepared according to the following procedure.

First, an Si single crystal wafer (in a disk form of 2 inches in diameter and 250 $\mu$m in thickness) was provided, which was cut and mirror polished so that its surface was defined by a (100) face. The surface of this wafer was cleaned by etching with a 40% aqueous solution of ammonium fluoride.

Then, the single crystal substrate 2 was fixed to the substrate holder 3 located in the vacuum chamber 1a in the evaporation system 1 shown in FIG. 14, and equipped with rotating and heating mechanisms. The vacuum chamber was evacuated to a vacuum of $10^{-6}$ Torr by means of an oil diffusion pump. To protect the cleaned surface of the substrate with an Si oxide, the substrate was rotated at 20 rpm and heated to 600° C. while oxygen was introduced from the nozzle 8 in the vicinity of the substrate at a flow rate of 10 cc/min., so that the surface of the substrate was thermally oxidized to form an Si oxide film of about 1 nm in thickness on the surface of the substrate.

Figure 5:
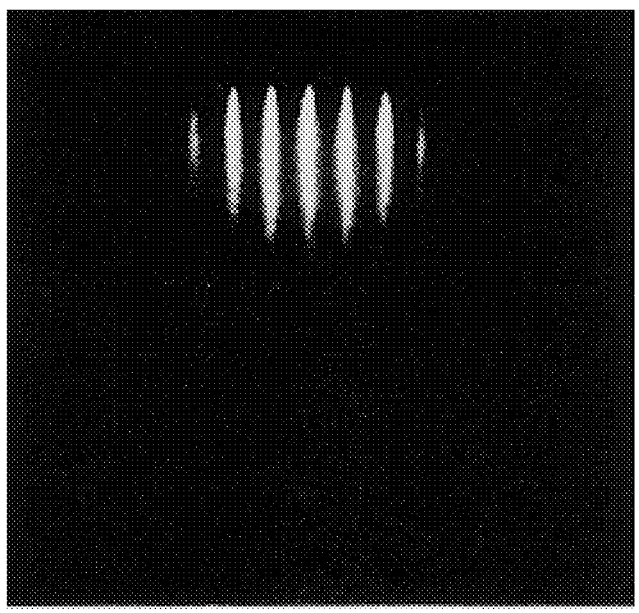
FIG. 5 is a photographic substitute for drawing, which shows a crystal structure, i.e., an RHEED image of a $ZrO_2$ thin film formed on a Si single crystal substrate.

Then, the substrate was heated to 900° C., and rotated at 20 rpm. At this point, an oxygen gas was introduced from the nozzle at a flow rate of 10 cc/min., while metallic Zr was evaporated from the evaporation source to feed Zr vapor to the surface of the substrate, thereby reducing the Si oxide formed at the former step and forming a thin film. The amount of the metallic Zr fed was 10 nm as calculated on a $ZrO_2$ film thickness basis. Upon x-ray diffraction of this thin film, a (002) peak for $ZrO_2$ was clearly observed; it was confirmed that the thin film is a $ZrO_2$ film of (001) unidirectional orientation and high crystallinity. In addition, the $ZrO_2$ thin film showed a perfect streaky RHEED pattern as shown in FIG. 5; it was confirmed that the $ZrO_2$ thin film is an epitaxial film having a flat surface on a molecular level and high crystallinity.

Figure 6:
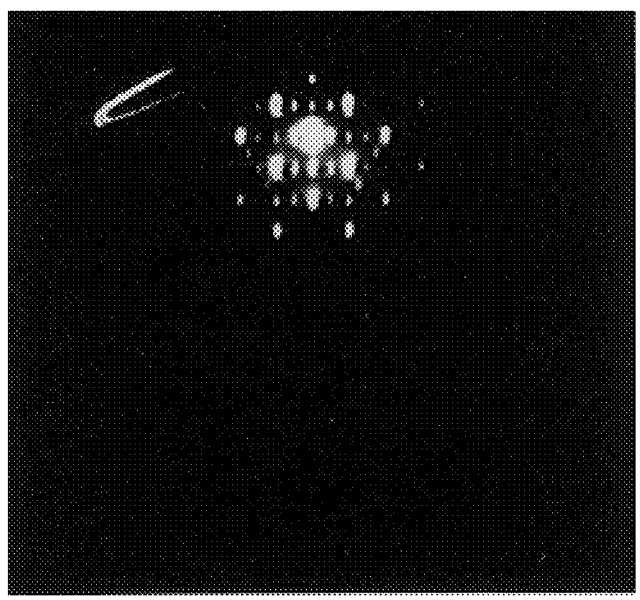
FIG. 6 is a photographic substitute for drawing, which shows a crystal structure, i.e., an RHEED image of a $Y_2O_3$ thin film formed on the $ZrO_2$ thin film, the RHEED image of which is shown in FIG. 5.

Then, metallic Y was fed to the surface of a substrate made up of the single crystal substrate with the $ZrO_2$ thin film formed thereon at a substrate temperature of 900° C., the number of revolutions of the substrate of 20 rpm, and an oxygen gas flow rate of 10 cc/min., thereby forming a $Y_2O_3$ thin film thereon. The amount of the metallic Y fed was 40 nm as calculated on a $Y_2O_3$ basis. This $Y_2O_3$ thin film showed a sharp, spotty RHEED image as can be seen from FIG. 6. This indicates that the $Y_2O_3$ thin film is an epitaxial film having good crystallinity with asperities on the surface. From an observation under a transmission electron microscope of a section of the $Y_2O_3$ thin film, it was found that facet planes of 10 nm in height are present at a ratio of 95% or more.

Figure 7:
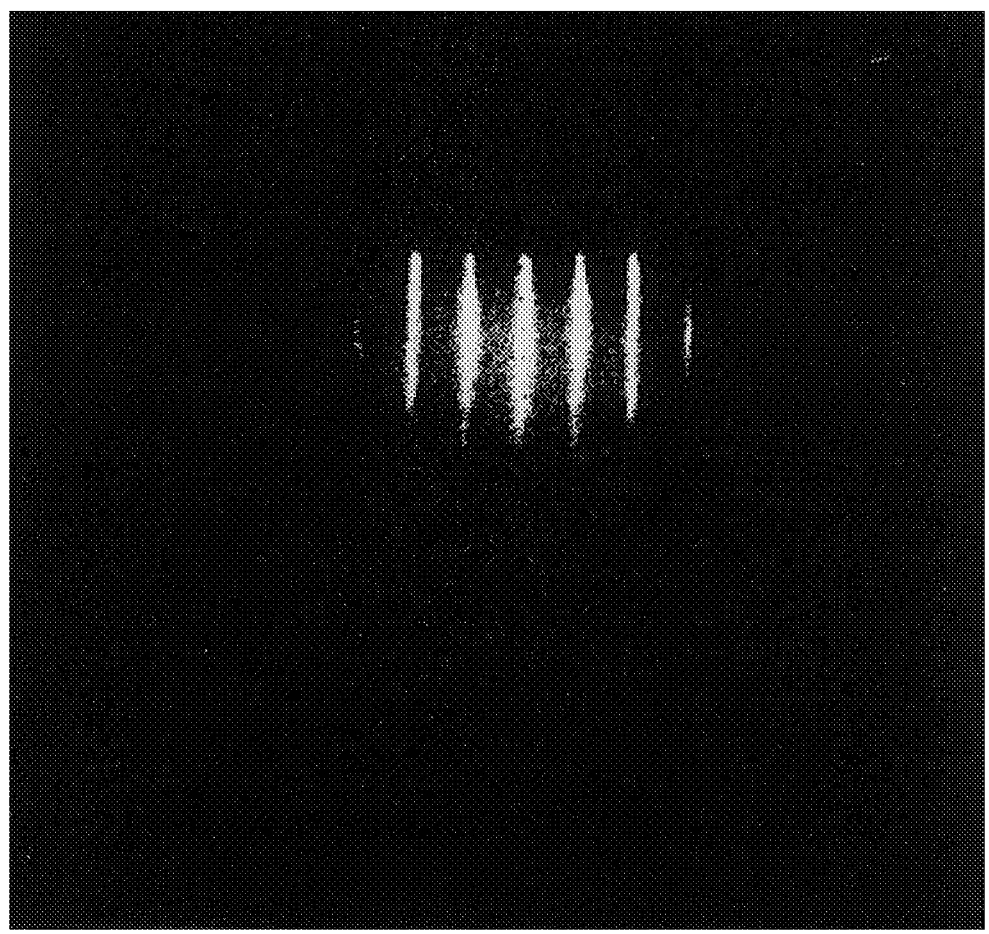
FIG. 7 is a photographic substitute for drawing, which shows a crystal structure, i.e., an RHEED image of $PbTiO_3$ thin film formed on the $Y_2O_3$ thin film, the RHEED image of which is shown in FIG. 6.

Then, a $PbTiO_3$ thin film of 300 nm in thickness was formed on the $Y_2O_3$ thin film. The substrate was set at 600° C., and rotated at 20 rpm. To inhibit the re-evaporation of Pb during film formation, radical oxygen was fed at a flow rate of 10 sccm. This $PbTiO_3$ thin film showed a sharp, streaky RHEED image as can be seen from FIG. 7. This indicates that the $PbTiO_3$ thin film is of good crystallinity, and has a flat surface on a molecular level.

Figure 8:
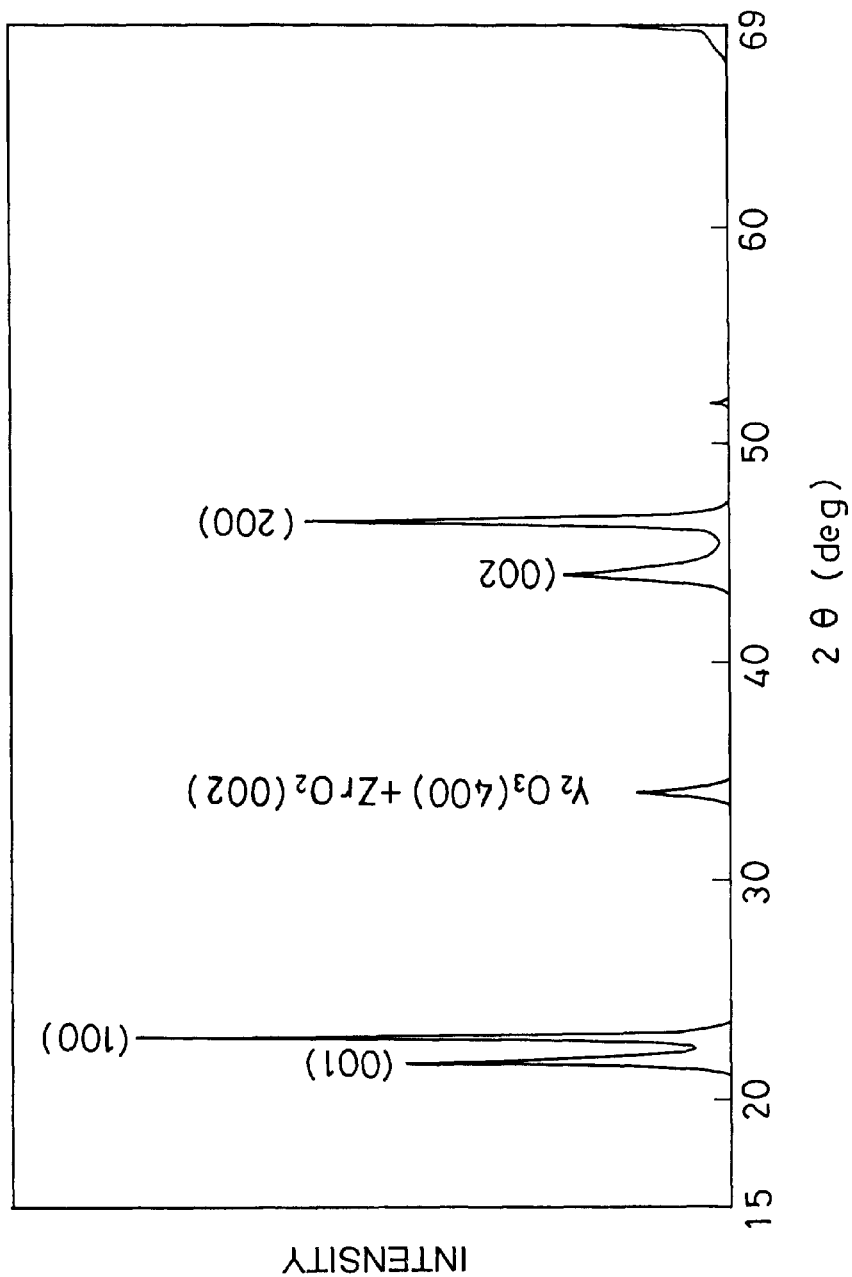
FIG. 8 is an x-ray diffraction chart of a $PbTiO_3/Y_2O_3/ZrO_2/Si(100)$ multilayer structure.

FIG. 8 is an x-ray diffraction chart of the thus obtained $PbTiO_3/Y_2O_3/ZrO_2/Si(100)$ multilayer structure. In FIG. 8, only two peaks, i.e., a peak for a face equivalent to $PbTiO_3$ (001) and a peak for a face equivalent to $PbTiO_3$ (100) are found. $PbTiO_3$ appears as a tetragonal crystal at room temperature; it is found to be a tetragonal domain structure film comprising (001) oriented crystals and (100) oriented crystals. From an observation under a transmission electron microscope of a section of the $PbTiO_3$ thin film, it was confirmed that the thin film has a domain structure. $PbTiO_3$ is present in a cubic form during growth; it is found that the cubic (100) oriented film has already been formed during growth.

Example 2 (First Embodiment)

A $ZrO_2$ thin film, and a $Y_2O_3$ thin film were formed on the Si (100) single crystal substrate as in Example 1. Then, a PZT thin film represented by $Pb(Zr_{0.25}Ti_{0.75})O_3$ was formed on the $Y_2O_3$ thin film by an evaporation process. The substrate was set at 600° C., and rotated at 20 rpm. To inhibit the re-evaporation of Pb during film formation, radical oxygen was fed at a flow rate of 10 sccm.

Figure 9:
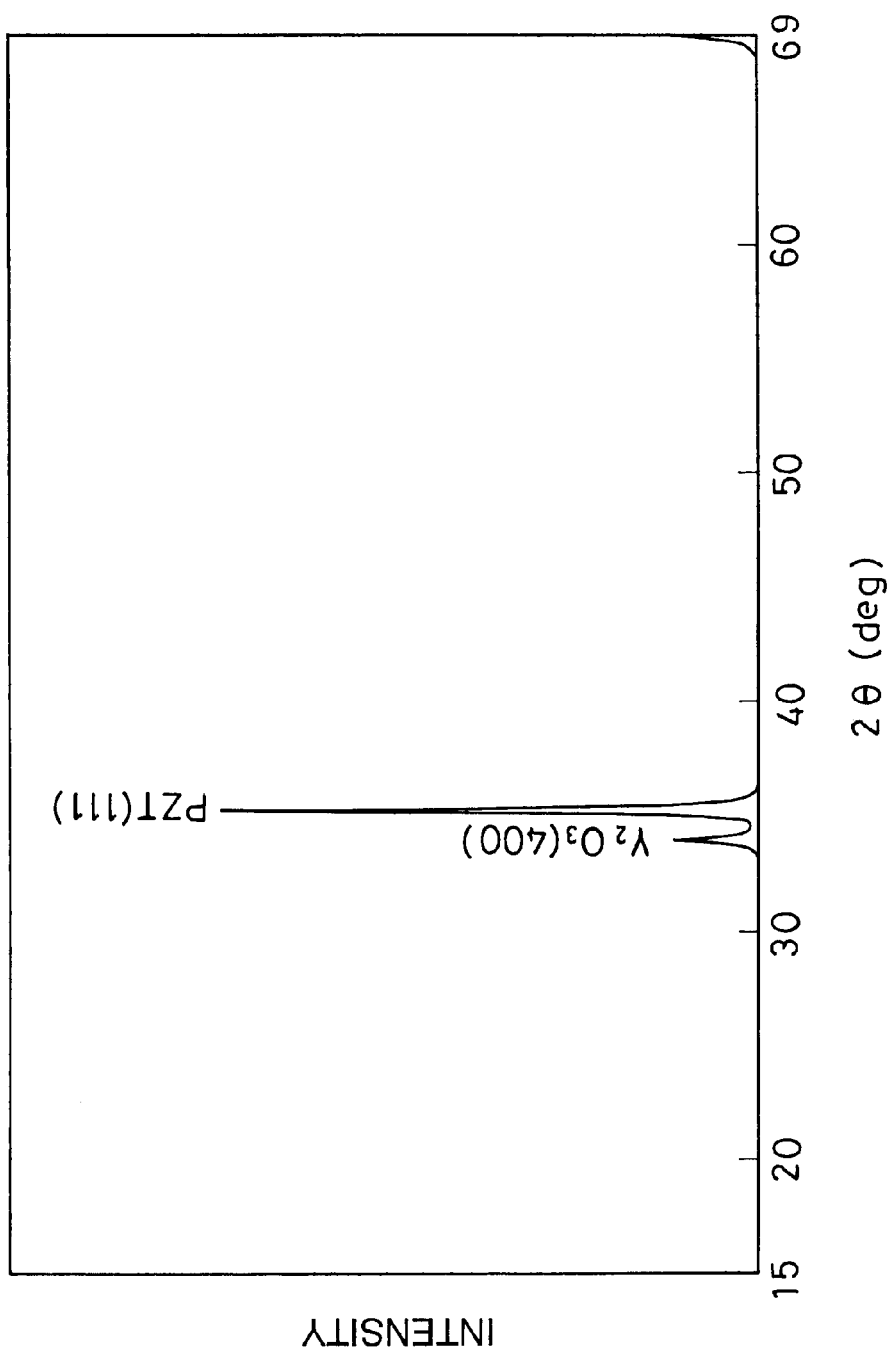
FIG. 9 is an x-ray diffraction chart of a $PZT/Y_2O_3/ZrO_2/Si(100)$ multilayer structure.

FIG. 9 is an x-ray diffraction chart of the thus obtained $PZT/Y_2O_3/ZrO_2/Si(100)$ multilayer structure. In FIG. 9, only a peak for a face equivalent to PZT(111) is found. In addition, the rocking curve of PZT(111) reflection had a half-width of 1.29°, indicating that the thin film is excellent in orientation capability.

Example 3 (First Embodiment)

A stabilized zirconia/Si(100) multilayer structure was prepared as in Example 1 with the exception that stabilized zirconia was used in place of the $ZrO_2$ and $Y_2O_3$ thin films. The composition of the stabilized zirconia was $Zr_{0.7}Y_{0.3}O_{2-\delta}$, and the substrate temperature, substrate rpm, and amount of oxygen fed during the formation of the stabilized zirconia thin film were the same as in the case of the formation of the $ZrO_2$ thin film in Example 1.

Figure 10:
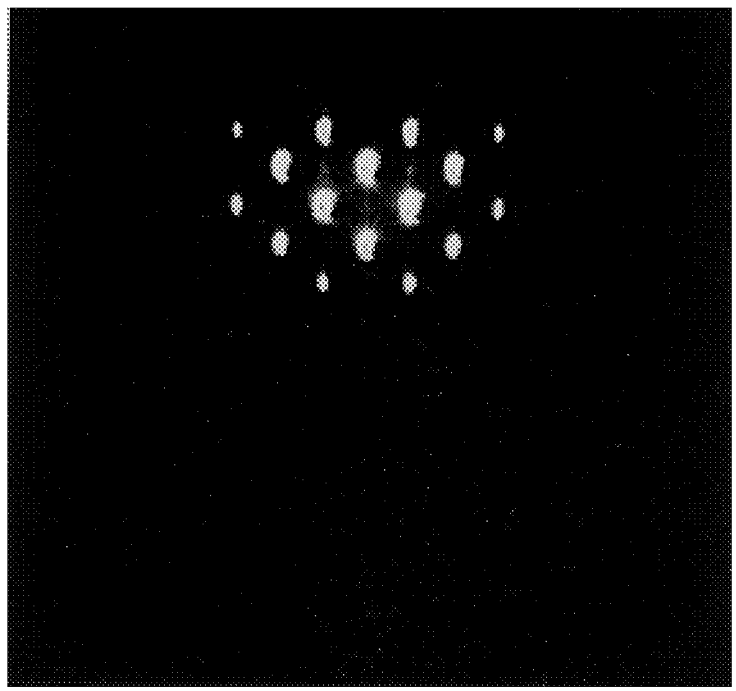
FIG. 10 is a photographic substitute for drawing, which shows a crystal structure, i.e., an RHEED image of a stabilized zirconia thin film formed on an Si single crystal substrate.
Figure 11:
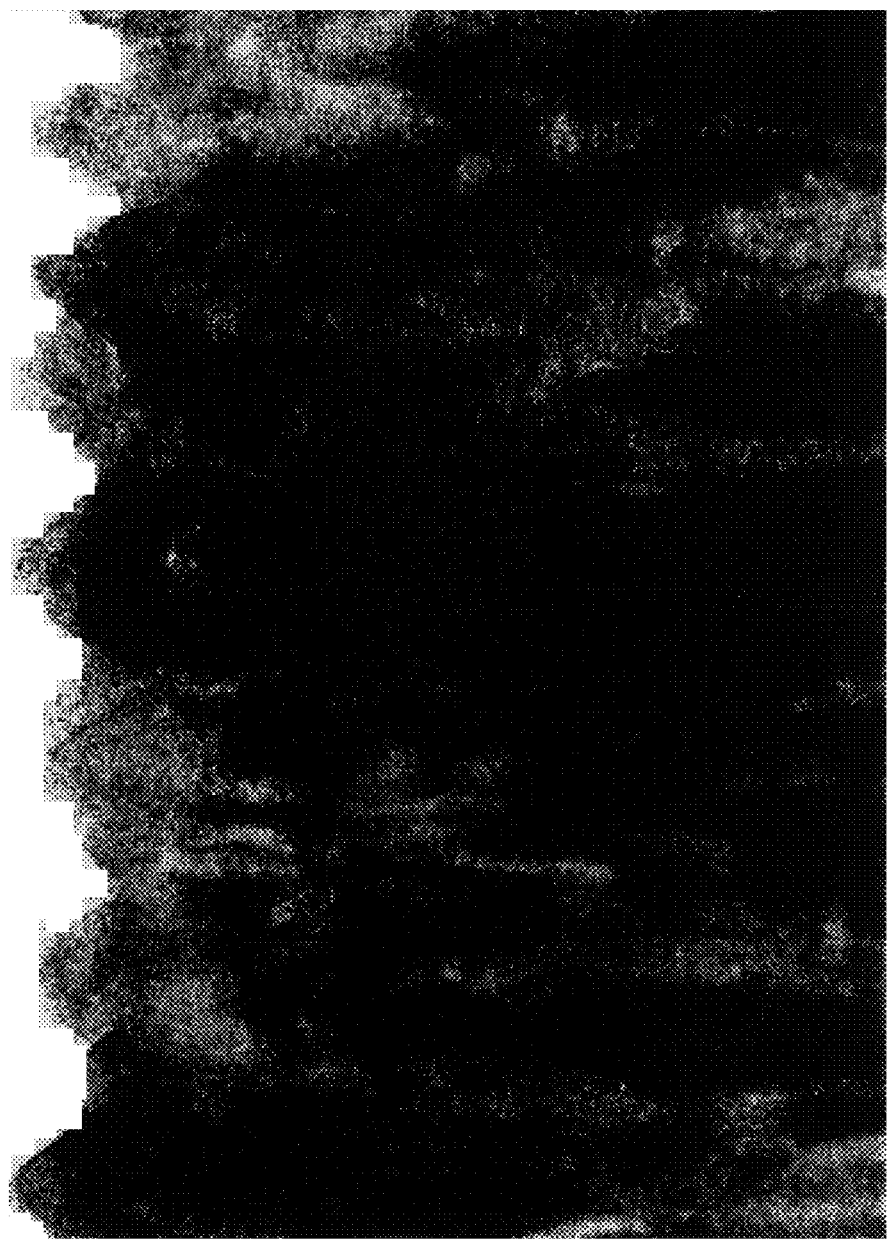
FIG. 11 is a photographic substitute for drawing, i.e., a transmission electron microscope photograph of a section of the stabilized zirconia formed on the Si single crystal substrate.

As can be seen from FIG. 10, the stabilized zirconia thin film showed a sharp, spotty RHEED image. From this, it is found that the stabilized zirconia thin film is an epitaxial film having good crystallinity with asperities on the surface thereof. FIG. 11 is a transmission electron microscope photograph of a section of the stabilized zirconia thin film. In FIG. 11, the side of the Si single crystal is shown on the right-handed side. It is also found that the surface of the buffer layer facing away from the substrate has almost no planes parallel to the surface of the substrate (the surface vertical to the paper), and are for the most part made up of facet planes. The ratio of the facet planes in the stabilized zirconia thin film was 90% or greater.

Perovskite oxide thin films were formed on the stabilized zirconia thin film according to the above examples. As a result, thin films of good crystallinity could be formed as in the above examples.

Example 4 (Second Embodiment)

A multilayer thin film comprising a $ZrO_2$ thin film, a $Y_2O_3$ thin film, and a Pt thin film stacked on an Si (100) single crystal substrate in this order was prepared according to the following procedure.

The $ZrO_2$ and $Y_2O_3$ thin films were prepared under the same conditions as in Example 1. As a result, the $Y_2O_3$ thin film having facet planes similar to those in Example 1 was formed.

Figure 12:
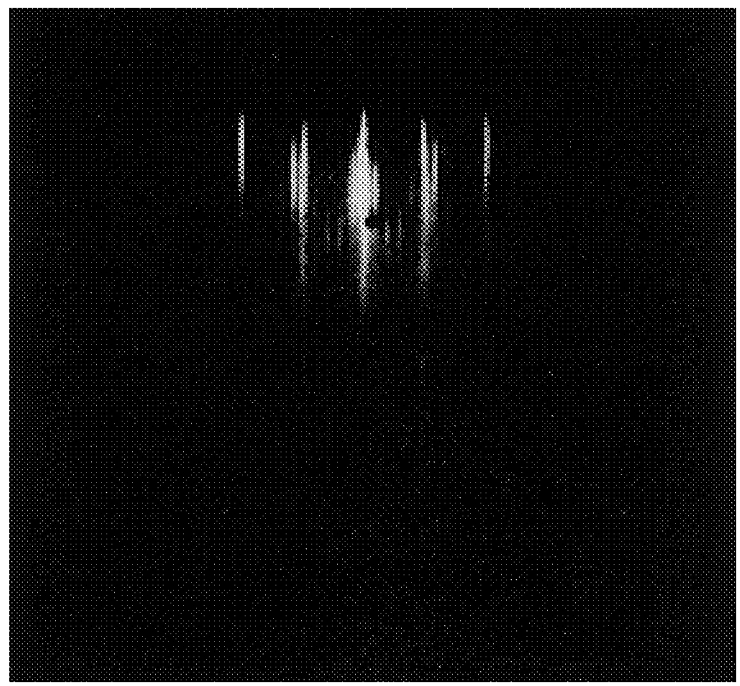
FIG. 12 is a photographic substitute for drawing, which shows a crystal structure, i.e., an RHEED image of a Pt thin film formed on the $Y_2O_3$ thin film, the RHEED image of which is shown in FIG. 6.

Then, the Pt thin film of 100 nm in thickness was formed on the $Y_2O_3$ thin film. The substrate was set at 700° C., and rotated at 20 rpm. As can be seen from FIG. 12, the Pt thin film showed a sharp, streaky RHEED image. From this, it is found that the Pt thin film is an epitaxial film having good crystallinity and a flat surface on a molecular level.

The ten-point mean surface roughness, Rz, of the Pt thin film (with a reference length of 1,000 nm) was 1.1 to 1.8 nm, as measured according to JIS B 0610, directly indicating that the thin film is excellent in surface flatness.

Figure 13:
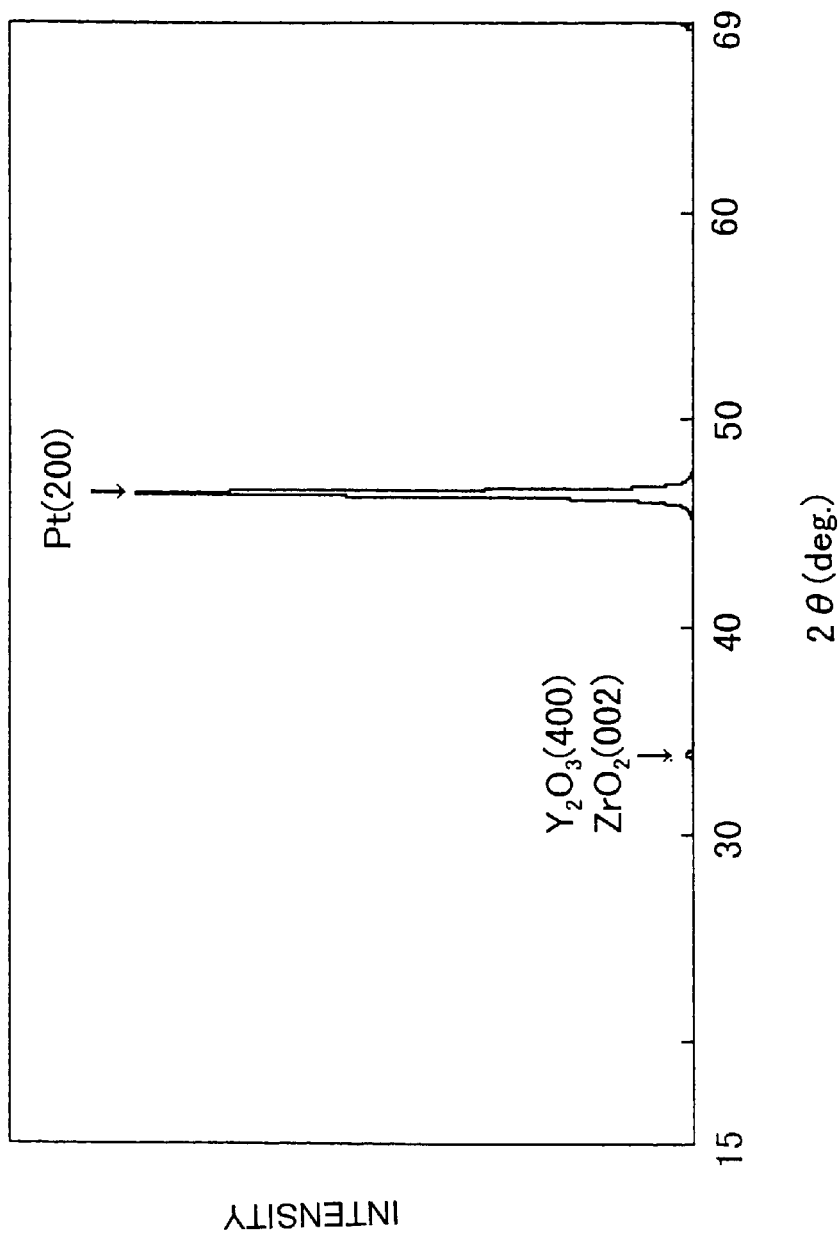
FIG. 13 is an x-ray diffraction chart of a $Pt/Y_2O_3/ZrO_2/Si(100)$ multilayer structure.

FIG. 13 is an x-ray diffraction chart of the thus obtained $Pt/Y_2O_3/ZrO_2/Si(100)$ multilayer structure. In FIG. 13, only two peaks for each thin film, i.e., a peak for a face equivalent to (100) and a peak for a face equivalent to (001) are found. From this, it is understood that each thin film is of (100) or (001) unidirectional orientation. In FIG. 13, the rocking curve of Pt (200) reflection had a half-width of 1.1°, indicating that the thin film is excellent in orientation capability.

ADVANTAGES OF THE INVENTION

Never until now is it reported that when the perovskite oxide thin film is formed on the facet plane present on the surface of the buffer layer, this thin film has tetragonal (100) orientation, tetragonal (001) orientation, or cubic or rhombohedral (111) orientation; the first emobidment of the invention is the first to find this fact. While it has so far been known that the $ZrO_2$ thin film or rare earth element oxide thin film may be used as the buffer layer, as previously stated, it is understood that when the perovskite oxide thin film is formed directly on a flat buffer layer, it tends to have (110) orientation or (101) orientation. In the first embodiment of the invention, this is used to grow the perovskite oxide with the (110) or (101) face parallel to the facet plane, thereby making it easy to form a perovskite oxide thin film that has (100) orientation, (001) orientation or (111) orientation, and is excellent in crystallinity. By a choice of lattice constant in the first embodiment of the invention, it is possible to arbitrarily select the orientation of each crystal type from (100) orientation, (001) orientation, and (111) orientation.

In the second embodiment of the invention, the buffer layer comprising at least one of a Zr oxide and a rare earth oxide is provided with a facet plane present on the surface thereof. When the metal thin film is formed directly on the surface of the buffer layer, the metal thin film appears as a film of (100) unidirectional orientation and excellent crystallinity. Further, the surface of the metal thin film becomes flat on a molecular level. Furthermore, the delamination of the metal thin film can be prevented because the area of contact of the buffer layer with the metal thin film is increased due to the presence of the facet plane.

In the second embodiment of the invention, it is unnecessary to locate any perovskite layer comprising $BaTiO_3$, etc. between the buffer layer and the metal thin film as a primer layer, unlike the aforesaid JP-A 9-110592, so that the fabrication process used can be simplified. The buffer layer according to the invention has a high buffer function because higher crystallinity is obtained in a stable manner as compared with a prior art perovskite layer used as a primer layer. In addition, the buffer layer according to the invention is less susceptible to pinholes when compared with a conventionally fabricated $BaTiO_3$ layer.

According the first embodiment of the invention, the perovskite oxide thin film can be used as function films comprising ferroelectric, piezoelectric, and superconducting materials, and according to the second embodiment of the invention, function films comprising ferroelectric, piezoelectric, and superconducting materials cam be stacked on substrates with a multilayer thin film formed thereon. It is thus possible to fabricate nonvolatile memories, infrared sensors, optical modulators, optical switches, OEICs, SAW devices, VCOs, convolvers, collimators, memory devices, image scanners, thin-film bulk resonators, filters, SQUIDs, Josephson devices, superconducting transistors, electromagnetic wave sensors, superconducting wired LSIs, etc.

What we claim is:

1. A multilayer thin film structure comprising a substrate, a buffer layer on said substrate, and a perovskite oxide thin film grown on said buffer layer, wherein an interface between said buffer layer and said perovskite oxide thin film is made up of a {111} facet plane, and substantially parallel to said facet plane there is present a {110} face of a cubic, rhombohedral, tetragonal or orthorhombic crystal of said perovskite oxide thin film, a {101} face of said tetragonal or orthorhombic crystal or a {011} face of said orthorhombic crystal.

2. The multilayer thin film structure according to claim 1, wherein said perovskite oxide thin film is an oriented film having one or two of (100) orientation, (001) orientation, and (010) orientation.

3. The multilayer thin film structure according to claim 1, wherein said perovskite oxide thin film is a (111) unidirectionally oriented film.

4. The multilayer thin film structure according to claim 1, wherein said perovskite oxide thin film comprises lead titanate, lead zirconate, or a solid solution thereof.

5. The multilayer thin film structure according to claim 1, wherein said buffer layer contains a rare earth element oxide, zirconium oxide, or a zirconium oxide with a part of Zr substituted by a rare earth element or an alkaline earth element.

6. The multilayer thin film structure according to claim 5, wherein an atomic ratio, R/(Z+R), in said buffer layer is 0.2 to 0.75 provided that R represents a rare earth element, and an alkaline earth element.

7. The multilayer thin film structure according to claim 5, which further comprises a primer layer on a side of said thin film that faces away from said perovskite oxide thin film with said buffer layer interleaved therebetween, said primer layer containing zirconium oxide or a zirconium oxide with a part of Zr substituted by a rare earth element or an alkaline earth element, provided that when said rare earth element and alkaline earth element are each represented by R, an atomic ratio, R/(Z+R), in said primer layer is smaller than said atomic ratio, R/(Z+R), in said buffer layer.

8. The multilayer thin film structure according to claim 1, which is present on a substrate having a surface made up of a Si (100) single crystal.

9. A multilayer thin film structure comprising a substrate, a metal thin film that is a cubic (100) unidirectionally oriented epitaxial film, and a buffer layer, wherein the buffer layer is on said substrate; and a {111} facet plane is present on an interface of said buffer layer that is in contact with said metal thin film.

10. The multilayer thin film structure according to claim 9, wherein said buffer layer contains a rare earth element oxide, zirconium oxide, or a zirconium oxide with a part of Zr substituted by a rare earth element or an alkaline earth element.

11. The multilayer thin film structure according to claim 10, wherein an atomic ratio, R/(Z+R), in said buffer layer is 0.2 to 0.75 provided that R represents a rare earth element, and an alkaline earth element.

12. The multilayer thin film structure according to claim 10, which further comprises a primer layer on a side of said thin film that faces away from said metal thin film with said buffer layer interleaved therebetween, said primer layer containing zirconium oxide or a zirconium oxide with a part of Zr substituted by a rare earth element or an alkaline earth element, provided that when said rare earth element and alkaline earth element are each represented by R, an atomic ratio, R/(Z+R), in said primer layer is smaller than said atomic ratio, R/(Z+R), in said buffer layer.

13. The multilayer thin film structure according to claim 9, wherein said metal thin film contains at least one of Pt, Ir, Pd, and Rh.

14. The multilayer thin film structure according to claim 9, which is present on a substrate having a surface made up of a Si (100) single crystal.

15. The multilayer thin film structure according to claim 1, wherein said substrate is a single crystal selected from the group consisting of Si, MgO and $SrTiO_3$.

16. The multilayer thin film structure according to claim 9, wherein said substrate is a single crystal selected from the group consisting of Si, MgO and $SrTiO_3$.

17. A method of making a multilayer thin film structure, the method comprising depositing a buffer layer and perovskite oxide thin film on a substrate; and forming the multilayer thin film structure of claim 1.

18. A method of making a multilayer thin film structure, the method comprising depositing a buffer layer and a metal thin film on a substrate; and forming the multilayer thin film structure of claim 9.

* * * * *

UNITED STATES PATENT AND TRADEMARK OFFICE
CERTIFICATE OF CORRECTION

PATENT NO. : 6,258,459 B1
DATED : July 10, 2001
INVENTOR(S) : Takao Noguchi et al.

It is certified that error appears in the above-identified patent and that said Letters Patent is hereby corrected as shown below:

<u>Column 23,</u>
Lines 5, 16, 17 and 33, "R/(Z+R)" should read -- R/(Zr+R) --.

<u>Column 24,</u>
Lines 9 and 10, "R/(Z+R)" should read -- R/(Zr+R) --.

Signed and Sealed this

Twenty-sixth Day of February, 2002

Attest:

JAMES E. ROGAN
*Attesting Officer*  *Director of the United States Patent and Trademark Office*